US009275776B1

(12) United States Patent
McNut

(10) Patent No.: US 9,275,776 B1
(45) Date of Patent: Mar. 1, 2016

(54) SHIELDING ELEMENTS FOR USE IN COMMUNICATION CABLES

(71) Applicant: Superior Essex International LP, Atlanta, GA (US)

(72) Inventor: Christopher W. McNut, Woodstock, GA (US)

(73) Assignee: Essex Group, Inc., Atlanta, GA (US)

( * ) Notice: Subject to any disclaimer, the term of this patent is extended or adjusted under 35 U.S.C. 154(b) by 0 days.

(21) Appl. No.: 14/578,921

(22) Filed: Dec. 22, 2014

Related U.S. Application Data

(63) Continuation-in-part of application No. 13/827,359, filed on Mar. 14, 2013.

(51) Int. Cl.
*H05K 9/00* (2006.01)
*H01B 11/06* (2006.01)

(52) U.S. Cl.
CPC .................................... *H01B 11/06* (2013.01)

(58) Field of Classification Search
CPC ................................ H01B 11/06; H01B 11/08
USPC .......................... 174/107, 32, 33, 34, 350, 36
See application file for complete search history.

(56) References Cited

U.S. PATENT DOCUMENTS

| | | | |
|---|---|---|---|
| 2,796,463 | A | 6/1957 | Mallinkrodt |
| 3,090,825 | A | 5/1963 | Volk |
| 3,135,935 | A | 6/1964 | Eugelbrecht |
| 3,312,774 | A | 4/1967 | Drinko |
| 3,373,475 | A | 3/1968 | Peterson |
| 3,612,744 | A | 10/1971 | Thomas |
| 4,129,841 | A | 12/1978 | Hildebrand et al. |
| 4,327,246 | A | 4/1982 | Kincaid |
| 4,604,497 | A | 8/1986 | Bell et al. |
| 4,638,272 | A | 1/1987 | Ive |
| 4,746,767 | A | 5/1988 | Gruhn |
| 4,881,642 | A | 11/1989 | Adam |
| 4,912,283 | A | 3/1990 | O'Connor |
| 5,006,806 | A | 4/1991 | Rippingale |

(Continued)

FOREIGN PATENT DOCUMENTS

| | | |
|---|---|---|
| GB | 2432963 | 6/2007 |
| JP | 200090748 | 3/2000 |

(Continued)

OTHER PUBLICATIONS

Office Action, mailed on Jul. 16, 2015, for U.S. Appl. No. 14/271,800.

(Continued)

*Primary Examiner* — Timothy Thompson
*Assistant Examiner* — Paul McGee, III

(57) ABSTRACT

Cables incorporating discontinuous shielding elements are described. A cable may include at least one twisted pair of individually insulated conductors, and a shield element may be positioned adjacent to the at least one twisted pair. The shield element may include a plurality of segments positioned along a longitudinal direction of the cable. Each segment may include a respective dielectric substrate with electrically conductive material formed on the substrate, and each segment may be electrically isolated from the other segments. A respective overlap may be formed between adjacent segments along a shared longitudinal edge. Additionally, a jacket may be formed around the at least one twisted pair and the shield element.

20 Claims, 20 Drawing Sheets

(56) References Cited

U.S. PATENT DOCUMENTS

| | | | |
|---|---|---|---|
| 5,008,489 | A | 4/1991 | Weeks et al. |
| 5,106,175 | A | 4/1992 | Davis et al. |
| 5,114,517 | A | 5/1992 | Rippingale et al. |
| 5,473,336 | A | 12/1995 | Harman et al. |
| 5,952,615 | A | 9/1999 | Prudhon |
| 5,956,445 | A | 9/1999 | Deitz et al. |
| 6,207,901 | B1 | 3/2001 | Smith et al. |
| 6,506,976 | B1 | 1/2003 | Neveux |
| 6,677,518 | B2 | 1/2004 | Hirakawa et al. |
| 6,687,437 | B1 | 2/2004 | Starnes et al. |
| 6,723,925 | B2 | 4/2004 | Ohara et al. |
| 6,737,574 | B2 | 5/2004 | Sylvia et al. |
| 6,770,819 | B2 | 8/2004 | Patel |
| 6,831,231 | B2 | 12/2004 | Perelman et al. |
| 6,850,161 | B1 | 2/2005 | Elliott |
| 6,888,070 | B1 | 5/2005 | Prescott |
| 7,173,189 | B1 | 2/2007 | Hazy et al. |
| 7,179,999 | B2 | 2/2007 | Clark et al. |
| 7,332,676 | B2 | 2/2008 | Sparrowhawk |
| 7,335,837 | B2 | 2/2008 | Pfeiler et al. |
| 7,834,270 | B2 | 11/2010 | Zhu et al. |
| 7,923,632 | B2 | 4/2011 | Smith et al. |
| 8,119,906 | B1 | 2/2012 | Smith et al. |
| 8,445,787 | B2 | 5/2013 | Nordin et al. |
| 8,558,115 | B2 | 10/2013 | Jenner et al. |
| 2006/0048961 | A1 | 3/2006 | Pfeiler et al. |
| 2007/0037419 | A1 | 2/2007 | Sparrowhawk |
| 2007/0224495 | A1 | 9/2007 | Gibbons et al. |
| 2007/0275583 | A1 | 11/2007 | McNutt et al. |
| 2008/0255435 | A1 | 10/2008 | Al-Ali et al. |
| 2008/0314636 | A1 | 12/2008 | Ogura |
| 2009/0200060 | A1 | 8/2009 | Smith et al. |
| 2009/0223694 | A1 | 9/2009 | Nordin et al. |
| 2009/0272571 | A1* | 11/2009 | Gromko ............... H01B 11/085 174/378 |
| 2010/0096179 | A1* | 4/2010 | Sparrowhawk .......... H04B 3/32 174/350 |
| 2010/0101853 | A1* | 4/2010 | McNutt .................. H01B 13/26 174/350 |
| 2010/0224389 | A1* | 9/2010 | Jenner ................ B23K 26/0846 174/113 R |
| 2011/0147039 | A1 | 6/2011 | Smith et al. |

FOREIGN PATENT DOCUMENTS

| | | |
|---|---|---|
| JP | 2006173044 | 6/2006 |
| WO | WO2006105166 | 5/2006 |

OTHER PUBLICATIONS

Final Office Action mailed on Mar. 3, 2015 for U.S. Appl. No. 13/827,359.

Office Action, mailed Jul. 9, 2015, in the U.S. Appl. No. 13/835,800.

Non-Final Rejection for U.S. Appl. No. 13/827,257, mailed on Jan. 14, 2015.

Non-Final Rejection for U.S. Appl. No. 13/827,359, mailed on Aug. 7, 2014.

“Product Catalogue” 2 pages, Enterprise cabling R&M, May 2006.

“Drake” 12 pages, Draka Comteq, Cable Solutions, Data Cables, Sep. 27, 2006.

Wetzikon, “R&M:The Rising Stars In Copper Cabling” 2 pages, Sep. 1, 2005.

“R&M Star Real 10” 2 pages, Mar. 2006.

“Connections 29” 36 pages, Sep. 2005.

Pfeiler et al., U.S. Pat. No. 7,336,837, issued Feb. 26, 2008.

Non-Final Rejection for U.S. Appl. No. 13/835,800, mailed on Feb. 19, 2015.

Notice of Allowance and Fee(s) Due in U.S. Appl. No. 13/827359, mailed on Oct. 2, 2015.

* cited by examiner

SHIELDING ELEMENTS FOR USE IN COMMUNICATION CABLES

CROSS-REFERENCES TO RELATED APPLICATIONS

This application is a continuation-in-part of U.S. patent application Ser. No. 13/827,359, filed Mar. 14, 2013, and entitled "Segmented Shields for Use in Communication Cables", which claims priority to U.S. Provisional Application No. 61/754,812, filed Jan. 21, 2013, and entitled "Segmented Shields for Use in Cables". The entire contents of each of these applications is incorporated by reference herein in its entirety.

Additionally, this application is related to U.S. patent application Ser. No. 14/578,925, filed Dec. 22, 2014, and entitled "Shielding Elements for Use in Communication Cables"; U.S. patent application Ser. No. 13/827,257, filed Mar. 14, 2013, and entitled "Segmented Shields for Use in Communication Cables"; U.S. patent application Ser. No. 12/653,804, filed Dec. 19, 2008, and entitled "Communication Cable Having Electrically Isolated Shield Providing Enhanced Return Loss"; U.S. patent application Ser. No. 12/313,914 (Now U.S. Pat. No. 7,923,641), filed Nov. 25, 2008, and entitled "Communication Cable Comprising Electrically Isolated Patches of Shielding Material"; U.S. patent application Ser. No. 11/502,777, filed Aug. 11, 2006, and entitled "Method and Apparatus for Fabricating Noise-Mitigating Cable"; U.S. patent application Ser. No. 12/313,910 (Now U.S. Pat. No. 7,923,632), filed Nov. 25, 2008, and entitled "Communication Cable Comprising Electrically Discontinuous Shield Having Nonmetallic Appearance"; U.S. patent application Ser. No. 12/583,797 (Now U.S. Pat. No. 8,119,906), filed Aug. 26, 2009, and entitled "Communication Cable Shielded With Mechanically Fastened Shielding Elements"; U.S. patent application Ser. No. 12/584,672 (Now U.S. Pat. No. 8,119,907), filed Sep. 10, 2009, and entitled "Communication Cable With Electrically Isolated Shield Comprising Holes"; U.S. patent application Ser. No. 13/039,918, filed Mar. 3, 2011, and entitled "Communication Cable Comprising Electrically Discontinuous Shield Having Nonmetallic Appearance"; and U.S. patent application Ser. No. 13/039,923, filed Mar. 3, 2011, and entitled "Communication Cable Comprising Electrically Discontinuous Shield Having Nonmetallic Appearance". The entire contents of each of these matters are incorporated by reference herein.

TECHNICAL FIELD

Embodiments of the disclosure relate generally to communication cables and, more particularly, to segmented or discontinuous shielding elements for use in communication cables.

BACKGROUND

As the desire for enhanced communication bandwidth escalates, transmission media need to convey information at higher speeds while maintaining signal fidelity. However, effects such as noise, interference, crosstalk, alien crosstalk, and/or alien equal-level far-end crosstalk ("ELFEXT") can strengthen with increased data rates, thereby degrading signal quality or integrity. For example, when two cables are disposed adjacent one another, data transmission in one cable can induce signal problems in the other cable via alien crosstalk interference.

Additionally, in certain types of cables, it is desirable to separate internal cable components. For example, certain cables make use of multiple twisted pairs of conductors to communicate signals. In each pair, the wires are twisted together in a helical fashion to form a balanced transmission line. When twisted pairs are placed in close proximity, such as within the core of a cable, electrical energy may be transferred from one pair of the cable to another pair. This crosstalk causes interference to the information being transmitted through the twisted pairs and can reduce the data transmission rate and cause an increase in bit rate error. Interlinking typically occurs when two adjacent twisted pairs are pressed together, and interlinking can lead to an increase in crosstalk among the wires of adjacent twisted pairs.

One approach to addressing signal degradation associated with communication cables is to circumferentially encase cables or various cable components in a continuous shield, such as a flexible metallic tube or a foil that coaxially surrounds the cable's conductors. However, shielding based on conventional technology can be expensive to manufacture and/or cumbersome to install in the field. In particular, complications can arise when a cable is encased by a shield that is electrically continuous between the two ends of the cable. The continuous shield can inadvertently carry voltage along the cable, for example from one terminal device at one end of the cable towards another terminal device at the other end of the cable. If a person contacts the shielding, the person may receive a shock if the shielding is not properly grounded. Accordingly, continuous cable shields are typically required to be grounded at both ends of the cable to reduce shock hazards and loop currents that can interfere with transmitted signals. Such a continuous shield can also set up standing waves of electromagnetic energy based on signals received from nearby energy sources. In this scenario, the shield's standing wave can radiate electromagnetic energy, somewhat like an antenna, that may interfere with wireless communication devices or other sensitive equipment operating nearby.

In order to address the limitations of continuous shields, segmented or discontinuous shields have been incorporated into certain cables. These segmented shields typically include metallic patches formed on a polymeric film with gaps or spaces formed between adjacent patches to maintain electrical discontinuity. Thus, the metallic patches function as an electromagnetic shield; however, it is not necessary to ground the shields during cable installation. Current segmented shield designs are typically manufactured by wrapping a shield tape either longitudinally or helically around a cable core or desired cable components. However, the spaces or gaps between the metallic patches may lead to electrical perturbations and decreased performance in the cable. Additionally, when a shield is wrapped around cable components, a space or gap may exist at an overlap region in which one edge of the shield overlaps the other edge in a circumferential direction. Accordingly, there is an opportunity for improved segmented shields, methods or techniques for forming segmented shields, and/or cables incorporating segmented shields.

Additionally, in order to improve crosstalk performance, separators (also referred to as separation fillers, fillers, interior supports, or splines) have been inserted into many conventional cables. These separators serve to separate adjacent twisted pairs and limit or prevent interlinking of the twisted pairs. Certain separators incorporate metallic material that performs a shielding function. However, these conventional separators typically suffer from the same problems as those described above for conventional shields. More specifically, separators having continuous metallic material can lead to shocking hazards unless properly grounded. Additionally, separators including discontinuous metallic material include gaps or spaces between metallic patches that may lead to electrical perturbations and decreased cable performance. Accordingly, there is an opportunity for improved separators or separation fillers for use in cables. There is additionally an opportunity for improved separators or separation fillers that include discontinuous patches or sections of shielding material, as well as cables incorporating such separators.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

DETAILED DESCRIPTION

Figure 1:
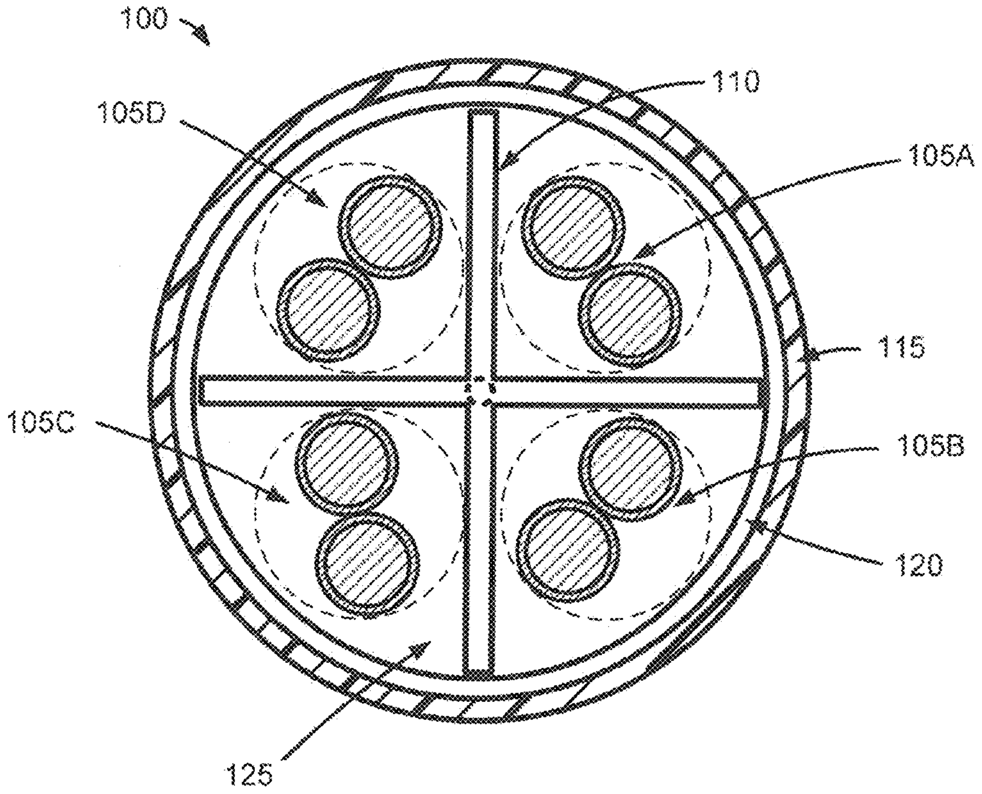
FIG. 1 is a cross-sectional view of an example cable including at least one shield element, according to an illustrative embodiment of the disclosure.

Various embodiments of the present disclosure are directed to shield elements for use in cables, such as twisted pair communication cables and/or other cables that incorporate electrical conductors. Other embodiments are directed to cables incorporating these shield elements. Example cables may include one or more transmission media within a core of the cable, such as one or more twisted pairs of conductors. Additionally, one or more shield elements may be incorporated into the cables. In certain embodiments, one or more shield layers may be incorporated into various cables. Shield layers may be utilized to wrap or longitudinally enclose one or more of the transmission media. For example, in various embodiments, shield layers may be utilized to wrap individual transmission media (e.g., individual twisted pairs), one or more groups of transmission media, and/or all of the transmission media positioned within a cable core. In other embodiments, one or more separators or fillers that function as shield elements may be incorporated into various cables. For example, a separator may be positioned within a cable core between at least two of the transmission media. In yet other embodiments, a combination of one or more separators and one or more shield layers may be utilized. Indeed, a wide variety of suitable shielding arrangements may be formed from various shield layers, separators, and/or combinations thereof.

According to an aspect of the disclosure, at least one shield element (e.g., shield layer, separator, etc.) may be formed to include a plurality of electrically conductive patches arranged in a discontinuous manner. In other words, a space or gap may be present between adjacent patches along a longitudinal direction of the cable. Additionally, according to an aspect of the disclosure, one or more techniques may be utilized to reduce and/or eliminate electrical perturbations between conductive patches and/or at the circumferential edges of a shield element. In certain embodiments, at least one electrically conductive patch included in a shield element may be electrically shorted or electrically continuous along a circumferential direction (e.g., along the circumference at a cross-sectional point perpendicular to a longitudinal direction of the cable). For example, when a shield is wrapped around one or more transmission media, a patch may contact itself, for example, at the edges of the shield. Assuming the shield extends along a longitudinal direction of the cable, then the shield may have a first edge and a second edge along a width dimension. A patch may extend approximately from the first edge to the second edge, and the patch may contact itself at or near the second edge. As another example, when a separator is formed, a patch may extend around an entire circumference of the separator. In certain embodiments, a separator may be formed from a tape that is folded into a desired shape, and one or more patches may be shorted in a circumferential direction at or near the edges of the tape. Although a patch is generally described herein as being shorted to itself at approximately edge portions of a patch (along a width direction of the patch and/or circumferential direction of a cable), a patch may be shorted to itself at any desired combination of two or more locations. For example, a shield element may overlap itself when formed and, therefore, the electrical shorting of a patch may occur at or near one edge of the shield element (i.e., the overlapping edge) but away from another edge (i.e., the overlapped edge) of the shield element.

As a result of a patch being electrically shorted to itself, a continuous patch may be formed in a circumferential direction or along a periphery of a shield element. When a shield element is formed to include a plurality of patches that are discontinuous in a longitudinal direction but electrically shorted in a circumferential direction, electrical perturbations caused by the shield element may be reduced relative to conventional cables. The circumferential shorting reduces or eliminates the ability for electrical noise, crosstalk, and/or other signals to leak through the shield element, for example, at the circumferential edges. Therefore, a cable may exhibit improved electrical performance, such as reduced return loss and/or reduced cross-talk loss.

Another example technique that may be utilized to improve the performance of a shield element involves the formation of a shield element with overlapping segments. As a result, certain longitudinal spaces or gaps between adjacent patches may effectively be eliminated while still providing a discontinuous shielding arrangement. As one example, a shield element may be formed from a plurality of longitudinally extending discrete segments. As desired, each segment may include electrically conductive material, and the electrically conductive material of any given segment may be electrically isolated from that of other segments. The segments may be arranged adjacent to one another along a longitudinal length of a cable, and an overlap may be formed between each adjacent segment. For example, a first segment may have a first longitudinal edge and a second longitudinal edge opposite the first edge. Similarly, a second may have a first longitudinal edge and a second longitudinal edge opposite the first edge. The first longitudinal edge of the second segment may overlap the second longitudinal edge of the first segment. In a similar manner, a third segment may overlap the second segment, and so on. Any suitable overlap may be utilized as desired in various embodiments, such as an overlap of approximately one quarter inch or greater, an overlap of approximately one half inch or greater, an overlap of approximately one inch or greater, or an overlap falling within a desired range.

As a result of utilizing overlapping longitudinal segments, the electrical properties of a shield element may be improved relative to conventional discontinuous shield elements. In conventional discontinuous shield elements, the longitudinal spaces or gaps between adjacent patches of electrically conductive material may lead to electrical perturbations and decreased performance in the cable. These spaces or gaps may be eliminated or reduced by certain embodiments of the disclosure, thereby improving electrical performance in the cable. In certain embodiments, a shield element having discontinuous electrically conductive shielding elements may be formed, and the shield element may provide shielding along the entire length of a cable. In other words, exposed gaps perpendicular to the cable's longitudinal axis (e.g., gaps between electrically conductive patches) may be eliminated, thereby improving electrical performance. For example, overall alien cross-talk performance may be improved and/or electrical perturbations due to gaps may be reduced or minimized.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

With reference to FIG. 1, a cross-section of an example cable 100 that may be utilized in various embodiments is illustrated. The cable 100 is illustrated as a twisted pair communications cable; however, other types of cables may be utilized, such as other cables that include electrical conductors (e.g., twisted pairs, etc.) and/or composite cables that include a combination of electrical conductors (e.g., twisted pairs, etc.) and other transmission media (e.g., optical fibers, etc.). The cable 100 may include any number of transmission media, such as one or more twisted pairs, one or more optical fibers, one or more coaxial cables, and/or one or more power conductors. As shown in FIG. 1, the cable 100 may include four twisted pairs 105A, 105B, 105C, 105D; however, any other number of pairs may be utilized. As desired, the twisted pairs may be twisted or bundled together and/or suitable bindings may be wrapped around the twisted pairs. In yet other embodiments, multiple grouping of twisted pairs may be incorporated into a cable. As desired, each grouping may be twisted, bundled, and/or bound together. Further, in certain embodiments, the multiple groupings may be twisted, bundled, or bound together. Additionally, embodiments of the disclosure may be utilized in association with horizontal cables, vertical cables, flexible cables, equipment cords, cross-connect cords, plenum cables, riser cables, or any other appropriate cables.

According to an aspect of the disclosure, the cable 100 may also include one or more shield elements. Shield elements may include, for example, shield layers wrapped around or enclosing one or more of the twisted pairs 105 and/or a separation filler 110 incorporating shielding material and positioned between one or more twisted pairs 105. As explained in greater detail below, in certain embodiments, at least one of the shield elements may include electrically conductive material that has been shorted to itself in a circumferential direction. In other embodiments, at least one of the shield elements may include discrete overlapping segments. Additionally, an outer jacket 115 may be formed around the twisted pairs 105 and one or more shield elements.

Any number of twisted pairs may be utilized as desired in the cable 100. As shown in FIG. 1, the cable 100 may include four twisted pairs 105A, 105B, 105C, 105D. As desired, the twisted pairs 105A-D may be twisted or bundled together and/or suitable bindings may be wrapped around the twisted pairs 105A-D. In other embodiments, multiple grouping of twisted pairs may be incorporated into a cable. As desired, each grouping may be twisted, bundled, and/or bound together. Further, in certain embodiments, the multiple groupings may be twisted, bundled, or bound together.

Each twisted pair (referred to generally as twisted pair 105 or collectively as twisted pairs 105) may include two electrical conductors, each covered with suitable insulation. As desired, each of the twisted pairs may have the same twist lay length or alternatively, at least two of the twisted pairs may include a different twist lay length. For example, each twisted pair may have a different twist rate. The different twist lay lengths may function to reduce crosstalk between the twisted pairs. As desired, the differences between twist rates of twisted pairs 105 that are circumferentially adjacent one another (for example the twisted pair 105A and the twisted pair 105B) may be greater than the differences between twist rates of twisted pairs 105 that are diagonal from one another (for example the twisted pair 105A and the twisted pair 105C). As a result of having similar twist rates, the twisted pairs that are diagonally disposed can be more susceptible to crosstalk issues than the twisted pairs 105 that are circumferentially adjacent; however, the distance between the diagonally disposed pairs may limit the crosstalk. Thus, the different twist lengths and arrangements of the pairs can help reduce crosstalk among the twisted pairs 105. Additionally, in certain embodiments, each of the twisted pairs 105A-D may be twisted in the same direction (e.g., clockwise, counter clockwise). In other embodiments, at least two of the twisted pairs 105A-D may be twisted in opposite directions.

The electrical conductors may be formed from any suitable electrically conductive material, such as copper, aluminum, silver, annealed copper, gold, or a conductive alloy. Additionally, the electrical conductors may have any suitable diameter, gauge, and/or other dimensions. Further, each of the electrical conductors may be formed as either a solid conductor or as a conductor that includes a plurality of conductive strands that are twisted together.

The insulation may include any suitable dielectric materials and/or combination of materials, such as one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or a combination of any of the above materials. Additionally, in certain embodiments, the insulation of each of the electrical conductors utilized in the twisted pairs 105A-D may be formed from similar materials. In other embodiments, at least two of the twisted pairs may utilize different insulation materials. For example, a first twisted pair may utilize an FEP insulation while a second twisted pair utilizes a non-FEP polymeric insulation. In yet other embodiments, the two conductors that make up a twisted pair may utilize different insulation materials.

In certain embodiments, the insulation may be formed from multiple layers of one or a plurality of suitable materials. In other embodiments, the insulation may be formed from one or more layers of foamed material. As desired, different foaming levels may be utilized for different twisted pairs in accordance with twist lay length to result in insulated twisted pairs having an equivalent or approximately equivalent overall diameter. In certain embodiments, the different foaming levels may also assist in balancing propagation delays between the twisted pairs. As desired, the insulation may additionally include other materials, such as a flame retardant materials, smoke suppressant materials, etc.

Each twisted pair 105 can carry data or some other form of information, for example in a range of about one to ten Giga bits per second ("Gbps") or another appropriate frequency, whether faster or slower. In certain embodiments, each twisted pair 105 supports data transmission of about two and one-half Gbps (e.g. nominally two and one-half Gbps), with the cable 100 supporting about ten Gbps (e.g. nominally ten Gbps). In certain embodiments, each twisted pair 105 supports data transmission of up to about ten Gbps (e.g. nominally ten Gbps), with the cable 100 supporting about forty Gbps (e.g. nominally forty Gbps).

The jacket 115 may enclose the internal components of the cable 100, seal the cable 100 from the environment, and provide strength and structural support. The jacket 115 may be formed from a wide variety of suitable materials and/or combinations of materials, such as one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or a combination of any of the above materials. The jacket 115 may be formed as a single layer or, alternatively, as multiple layers. In certain embodiments, the jacket 115 may be formed from one or more layers of foamed material. As desired, the jacket 115 can include flame retardant and/or smoke suppressant materials. Additionally, the jacket 115 may include a wide variety of suitable shapes and/or dimensions. For example, the jacket 115 may be formed to result in a round cable or a cable having an approximately circular cross-section; however, the jacket 115 and internal components may be formed to result in other desired shapes, such as an elliptical, oval, or rectangular shape. The jacket 115 may also have a wide variety of dimensions, such as any suitable or desirable outer diameter and/or any suitable or desirable wall thickness. In various embodiments, the jacket 115 can be characterized as an outer jacket, an outer sheath, a casing, a circumferential cover, or a shell.

An opening enclosed by the jacket 115 may be referred to as a cable core 125, and the twisted pairs 105A-D may be disposed within the cable core 125. Although a single cable core is illustrated in the cable 100 of FIG. 1, a cable may be formed to include multiple cable cores. In certain embodiments, the cable core 125 may be filled with a gas such as air (as illustrated) or alternatively a gelatinous, solid, powder, moisture absorbing material, water-swellable substance, dry filling compound, or foam material, for example in interstitial spaces between the twisted pairs 105A-D. Other elements can be added to the cable core 125 as desired, for example one or more optical fibers, additional electrical conductors, additional twisted pairs, water absorbing materials, and/or strength members, depending upon application goals.

Figure 2:
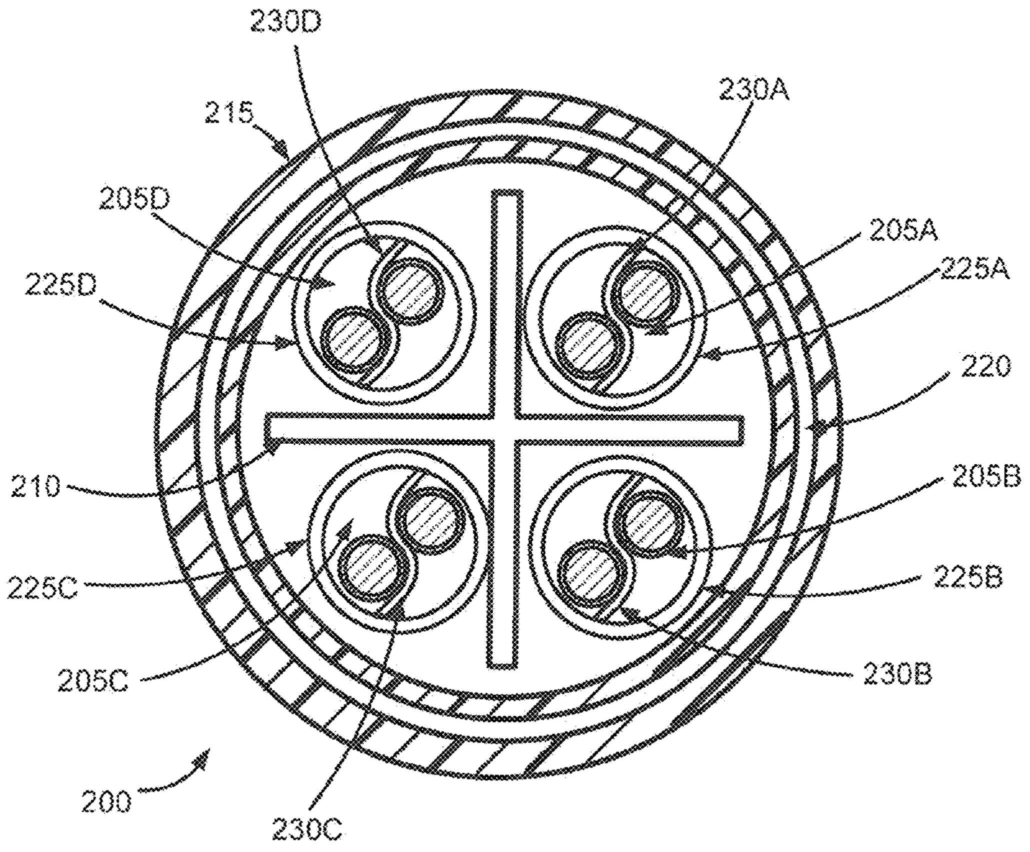
FIG. 2 is a cross-sectional view of another example cable including at least one shield element, according to an illustrative embodiment of the disclosure.
Figure 3:
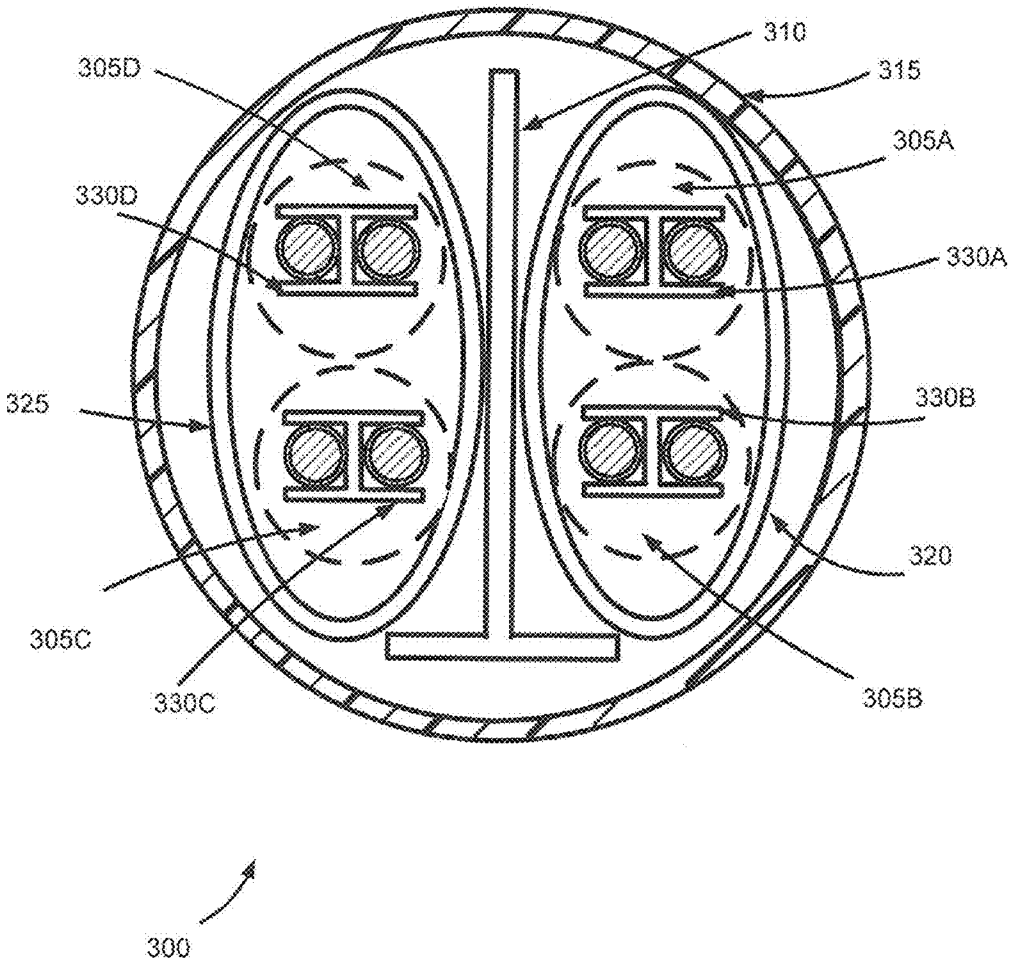
FIG. 3 is a cross-sectional view of another example cable including at least one shield element, according to an illustrative embodiment of the disclosure.

In certain embodiments, one or more shield layers can be disposed between the jacket 115 and one or more additional cable components. For example, as shown in FIG. 1, an external shield 120 or an overall shield may be disposed between the jacket 115 and the twisted pairs 105. In other words, the external shield may be wrapped around and/or encompass the collective group of twisted pairs. In certain embodiments, the shield 120 may be positioned between the twisted pairs 105 and the outer jacket 115. In other embodiments, the shield 120 may be embedded into the outer jacket 115, incorporated into the outer jacket 115, or even positioned outside of the outer jacket 115. As another example, as illustrated in FIG. 2, individual shields may be provided for each of the twisted pairs. As yet another example, as illustrated in FIG. 3, shield layers may be provided for any desired groupings of twisted pairs. As desired, multiple shield layers may be provided, for example, individual shields and an overall shield. One or more shield layers may incorporate electrically conductive material in order to provide electrical shielding for one or more cable components. Further, in certain embodiments, the cable 100 may include a separate, armor layer (e.g., a corrugated armor, etc.) for providing mechanical protection.

Various embodiments of the external shield 120 illustrated in FIG. 1 are generally described herein; however, it will be appreciated that other shield layers may have similar constructions. In certain embodiments, a shield 120 may be formed from a single segment or portion that extends along a longitudinal length of the cable 100. In other embodiments, a shield 120 may be formed from a plurality of discrete segments or portions positioned adjacent to one another along a longitudinal length of the cable 100. In the event that discrete segments or portions are utilized, in certain embodiments, gaps or spaces may exist between adjacent segments or portions. In other embodiments, as explained in greater detail below, certain segments may overlap one another. For example, an overlap may be formed between segments positioned adjacent to one another along a longitudinal length of the cable.

As desired, a wide variety of suitable techniques and/or processes may be utilized to form a shield 120 (or a shield segment). As one example, a base material or dielectric material may be extruded, poltruded, or otherwise formed. Electrically conductive material may then be applied to the base material. In other embodiments, electrically conductive material may be injected into the base material. In other embodiments, dielectric material may be formed or extruded over electrically conductive material in order to form a shield 120. Indeed, a wide variety of suitable techniques may be utilized to incorporate electrically conductive material into a shield 120. In certain embodiments, the base layer may have a substantially uniform composition and/or may be made of a wide range of materials. Additionally, the base layer may be fabricated in any number of manufacturing passes, such as a single manufacturing pass. Further, the base layer may be foamed, may be a composite, and/or may include one or more strength members, fibers, threads, or yarns. As desired, flame retardant material, smoke suppressants, and/or other desired substances may be blended or incorporated into the base layer.

In certain embodiments, the shield 120 (or individual shield segments) may be formed as a tape that includes both a dielectric layer and an electrically conductive layer (e.g., copper, aluminum, silver, an alloy, etc.) formed on one or both sides of the dielectric layer. Examples of suitable materials that may be used to form a dielectric layer include, but are not limited to, various plastics, one or more polymeric materials, one or more polyolefins (e.g., polyethylene, polypropylene, etc.), one or more fluoropolymers (e.g., fluorinated ethylene propylene ("FEP"), polyester, polytetrafluoroethylene, polyimide, or some other polymer, combination of polymers, or dielectric material(s) that does not ordinarily conduct electricity. In certain embodiments, a separate dielectric layer and electrically conductive layer may be bonded, adhered, or otherwise joined (e.g., glued, etc.) together to form the shield 120. In other embodiments, electrically conductive material may be formed on a dielectric layer via any number of suitable techniques, such as the application of metallic ink or paint, liquid metal deposition, vapor deposition, welding, heat fusion, adherence of patches to the dielectric, or etching of patches from a metallic sheet. In certain embodiments, the conductive patches can be over-coated with an electrically insulating film, such as a polyester coating. Additionally, in certain embodiments, an electrically conductive layer may be sandwiched between two dielectric layers. In other embodiments, at least two electrically conductive layers may be combined with any number of suitable dielectric layers to form the shield 120. For example, a four layer construction may include respective electrically conductive layers formed on either side of a first dielectric layer. A second dielectric layer may then be formed on one of the electrically conductive layers to provide insulation between the electrically conductive layer and the twisted pairs 105. Indeed, any number of suitable layers of material may be utilized to form a tape which may be used as the shield 120.

In certain embodiments, the cable 100 may include a separator 110 or filler disposed within the cable core 125 and configured to orient and or position one or more of the twisted pairs 105A-D. The orientation of the twisted pairs 105A-D relative to one another may provide beneficial signal performance. As desired in various embodiments, the separator 110 may be formed in accordance with a wide variety of suitable dimensions, shapes, or designs. For example, a rod-shaped separator, a flat tape separator, a flat separator, an X-shaped or cross-shaped separator, a T-shaped separator, a Y-shaped separator, a J-shaped separator, an L-shaped separator, a diamond-shaped separator, a separator having any number of spokes extending from a central point, a separator having walls or channels with varying thicknesses, a separator having T-shaped members extending from a central point or center member, a separator including any number of suitable fins, and/or a wide variety of other shapes may be utilized. A few example cross-sectional shapes that may be utilized for separators are described in greater detail below with reference to FIGS. 5A-5L. In certain embodiments, material may be cast or molded into a desired shape to form the separator 110. In other embodiments, a tape may be formed into a desired shape utilizing a wide variety of folding and/or shaping techniques. For example, a relatively flat tape separator may be formed into an X-shape or cross-shape as a result of being passed through one or more dies.

In certain embodiments, a separator 110 may be formed from a single segment or portion. In other words, the separator 110 may be formed as a relatively continuous separator along a longitudinal length of the cable 100. In other embodiments, a separator 110 may be formed from a plurality of discrete segments or portions. For example, discrete segments or portions may be positioned adjacent to one another along a longitudinal length of the separator 110. In certain embodiments, gaps or spaces may be present between various segments or portions of the separator 110. In other embodiments, at least a portion of the segments may be arranged in an overlapping configuration. For example, as explained in greater detail below, adjacent segments may overlap one another at shared longitudinal edges. Additionally, in certain embodiments, electrically conductive material may be incorporated into a separator 110. For example, a separator 110 may include electrically conductive material, such as one or more electrically conductive patches (e.g., metallic patches, etc.) formed on or adhered to a dielectric substrate or base. As another example, a separator 110 may include electrically conductive material embedded into or impregnated into a dielectric material. As a result of incorporating electrically conductive material, the separator 110 may function as a shielding element.

The separator 110 may be formed from a wide variety of suitable materials as desired in various embodiments. For example, the dielectric base of the separator 110 and/or various separator segments can include paper, metals, alloys, various plastics, one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or any other suitable material or combination of materials. As desired, the separator 110 may be filled, unfilled, foamed, un-foamed, homogeneous, or inhomogeneous and may or may not include additives (e.g., flame retardant and/or smoke suppressant materials).

As desired, a wide variety of suitable techniques and/or processes may be utilized to form the separator 110 or various segments of the separator 110. For example, a base material or dielectric material may be extruded, poltruded, or otherwise formed. In certain embodiments, electrically conductive material may be applied to the base material, inserted into the base material, or embedded in the base material. In other embodiments, dielectric material may be formed around electrically conductive material. As desired, the base layer may have a substantially uniform composition, may be made of a wide range of materials, and/or may be fabricated in a single manufacturing pass. Further, the base layer may be foamed, may be a composite, and may include one or more strength members, fibers, threads, or yarns. Additionally, as desired, the base layer may be hollow and/or include any number of longitudinally extending cavities that may optionally be filled with air or some other gas, gel, fluid, moisture absorbent, water-swellable substance, dry filling compound, powder, one or more optical fibers, one or more metallic conductors (e.g., a drain wire, etc.), shielding, or some other appropriate material or element.

In certain embodiments, the separator 110 may be formed as a tape that includes one or more dielectric layers (e.g., plastic, polyester, polyethylene, polypropylene, fluorinated ethylene propylene, polytetrafluoroethylene, polyimide, or some other polymer or dielectric material that does not ordinarily conduct electricity etc.) and, if desired, an electrically conductive layer (e.g., copper, aluminum, an alloy, etc.). A tape separator may be formed in a similar manner as the tape shield layer described above. Additionally, when a separator is formed from a tape, the tape may be formed such that it longitudinally encloses one or more other components of the cable 100, such as one or more optical fibers, a drain wire, etc.

For a segmented separator formed from a plurality of discrete segments, the various portions or segments of the separator 110 may include a wide variety of different lengths and/or sizes. For example, a portion of the separator 110 may be approximately six inches, one foot, two feet, or any other suitable length. As another example, a portion of the separator 110 may be approximately half a meter, one meter, two meters, or three meters. In certain embodiments, portions of the separator 110 may be approximately three meters or less. In certain embodiments, portions having a common length may be incorporated into the cable 100. In other embodiments, portions of the separator 110 may have varying lengths. These varying lengths may follow an established pattern or, alternatively, may be incorporated into the cable at random. Additionally, in certain embodiments, each segment or portion of the separator 110 may be formed from similar materials. In other embodiments, a separator 110 may make use of alternating materials in adjacent portions (whether or not a gap is formed between adjacent portions). For example, a first portion or segment of the separator 110 may be formed from a first set of one or more materials, and a second portion or segment of the separator 110 may be formed from a second set of one or more materials. As one example, a relatively flexible material may be utilized in every other portion of a separator 110. As another example, relatively expensive flame retardant material may be selectively incorporated into desired portions of a separator 110. In this regard, material costs may be reduced while still providing adequate flame retardant qualities.

According to an aspect of the disclosure, one or more techniques may be utilized to reduce and/or eliminate electrical perturbations between conductive patches and/or at the circumferential edges of a shield element. As desired, these techniques may be applied to shield layers (e.g., the external shield 120, etc.) and/or to separators 110. As one example technique, in certain embodiments, at least one electrically conductive patch included in a shield element may be electrically shorted or electrically continuous along a circumferential direction of the shield element. As another example technique, a shield element may be formed with overlapping segments in order to effectively eliminate longitudinal spaces or gaps between adjacent patches formed on the shield element. Each of these techniques are described in greater detail below.

In certain embodiments, at least one electrically conductive patch included in a shield element, such as shield 120 or separator 110, may be electrically shorted or continuous along a circumferential direction. For example, when a shield 120 (or a plurality of shield segments) is wrapped around one or more twisted pairs 105A-D, a patch may contact itself at or near the edges of the shield 120. As another example, when a separator 110 is formed from a tape, a patch may contact itself at or near the edges of the tape 110. As yet another example, a patch may be formed on a separator 110 such that the patch extends around the circumference of the separator 110 and contacts itself. In any of these examples, the patch may be electrically shorted to itself, thereby creating a continuous patch in a circumferential direction or along a periphery of the shield element. When the shield element is formed to include a plurality of patches that are discontinuous in a longitudinal direction and one or more patches are electrically shorted in a circumferential direction, electrical perturbations caused by the shield element may be reduced relative to conventional cables. Therefore, the cable 100 may exhibit improved electrical performance, such as reduced return loss and/or reduced cross-talk loss.

A wide variety of suitable methods or techniques may be utilized to electrically short patches in a circumferential direction. A few example methods or techniques that may be utilized in conjunction with shield layers, such as shield 120, are illustrated and described in greater detail below with reference to FIGS. 5A-5D. A few example methods or techniques that may be utilized in conjunction with separators are illustrated and described in greater detail below with reference to FIGS. 9, 10, 11A-11H, and 12-15. It will be appreciated that other suitable methods or techniques may be utilized as desired and that the described techniques are provided by way of example only.

In certain embodiments, at least one shield element, such as shield 120 or separator 110, may be formed to include overlapping segments. As desired, a shield element may be formed to include a plurality of electrically conductive patches arranged in a discontinuous manner. In other words, the electrically conductive patches may be electrically isolated from one another. However, in contrast to conventional shield elements, the shield element may not include spaces or gaps between certain patches along a longitudinal direction of the cable. The shield element may include a plurality of discrete overlapping segments or sections along a longitudinal length of the cable, and each segment may include at least one electrically conductive patch or portion. The combination of the segments may form a discontinuous shield element;

however, the overlapping nature of the segments may eliminate gaps between certain patches along a longitudinal direction. Thus, the discontinuous shield element may exhibit improved electrical performance relative to conventional discontinuous shields.

When forming a shield element, each shield element segment may include a carrier layer (e.g., a dielectric layer, etc.) with one or more electrically conductive patches formed thereon. Adjacent segments may be positioned in the cable 100 so that an end of a first segment (e.g., a second or distal end along the longitudinal direction or length of the cable 100) is overlapped by the first end of a second segment. In other words, the segments may be incorporated into the cable 100 to include overlapping edges along a length of the cable 100. Further, the carrier layers of the shield segments may provide isolation between the electrically conductive patches formed on each segment. For example, at an overlapping region, a first segment may include an electrically conductive patch formed on a dielectric material. A second segment may have a similar construction. When incorporated into the cable 100, the dielectric material of the second segment may be positioned over, positioned around, and/or in contact with the electrically conductive patch of the first segment at the overlapping region. Thus, electrical isolation exists between the electrically conductive patch of the first segment and the electrically conductive patch of the second segment.

A wide variety of suitable methods or techniques may be utilized as desired to form a shield element with overlapping segments. For example, in certain embodiments, electrically conductive material (e.g., one or more patches of electrically conductive material) may be formed on a carrier or substrate layer (e.g., a dielectric layer, a tape, etc.), and the carrier layer may be cut or otherwise divided in order to form segments that will be utilized in the shield element. In other embodiments, respective electrically conductive material may be formed on a plurality of carrier or substrate layers (e.g., precut sections of a dielectric material, etc.) that will be incorporated into the shield element. In other embodiments, one or more patches may be sandwiched between two carrier layers (e.g., two dielectric layers). Once suitable segments have been formed, the segments may be assembled in a desired overlapping configuration to form the shield element. In certain embodiments, the various segments may be arranged in an overlapping configuration during construction of the cable 100. In other words, a shield element may be formed in an online manner during cable assembly. In other embodiments, the various segments may be overlapped in an offline process and the resulting shield element may be incorporated into the cable 100.

Additionally, when incorporated into the cable 100, any number of suitable techniques may be utilized as desired to hold the segments of a shield element in place. For example, an adhesive (e.g., a contact adhesive, a pressure sensitive adhesive, a hot melt adhesive) may be applied to a segment in order to adhere the segment to one or more other segments, the transmission media, an inner surface of an outside cable jacket, and/or to any other desired components of a cable (e.g., an armor layer, a water-blocking layer, a tube, etc.). In other embodiments, segments may be adhered or otherwise combined together prior to incorporation of the shield element into the cable 100.

A wide variety of segment overlap distances may be utilized in various embodiments of the disclosure. For example, a first segment may overlap a second segment along a longitudinal direction of the cable 100 by approximately 0.25 inches (0.00635 meters), 0.5 inches (0.0127 meters), 1 inch (0.0254 meters), 1.5 inches (0.0381 meters), 2 inches (0.0508 meters), more than approximately 0.25 inches, more than approximately 0.5 inches, more than approximately 1 inch, more than approximately 2 inches, a distance included in any suitable range formed using any of the values above, or any other desirable distance. In certain embodiments, a first segment may overlap a second segment by approximately 8 inches or less. In other embodiments, a first segment may overlap a second segment by approximately 1.5 inches or less. Additionally, in certain embodiments, the overlap distances formed between various pairs of segments may be approximately equal. In other embodiments, various pairs of segments may have different overlap distances.

According to an aspect of the disclosure, a shield element may be formed as a discontinuous shield element having a plurality of isolated electrical patches. For continuous shield elements (e.g., non-overlapping shield elements), a plurality of patches of electrically conductive material may be incorporated into the shield element, and gaps or spaces may be present between adjacent patches in a longitudinal direction. For segmented shield elements, in certain embodiments, each segment or section of the shield element may include either a single patch of electrically conductive material. In other embodiments, a segment of a shield element may include a plurality of electrically conductive patches, and gaps or spaces may be present between adjacent patches. For example, a plurality of discontinuous patches may be formed on one side of a carrier layer with gaps between adjacent patches. As desired in shield elements or segments having a plurality of patches, patches may be formed on the other side of the carrier layer to cover the gaps or spaces. A wide variety of different patch patterns may be formed as desired in various embodiments, and a patch pattern may include a period or definite step. In other embodiments, patches may be randomly formed or situated on a carrier layer. As desired, any number of carrier layers and electrically conductive layers may be utilized within a shield element or segment of a shield element. A few example configurations for forming shield elements are described in greater detail below with reference to FIGS. 6A-C and FIGS. 7A-D.

A wide variety of suitable electrically conductive materials or combination of materials may be utilized to form electrically conductive patches incorporated into a shield element including, but not limited to, metallic material (e.g., silver, copper, nickel, steel, iron, annealed copper, gold, aluminum, etc.), metallic alloys, conductive composite materials, etc. Indeed, suitable electrically conductive materials may include any material having an electrical resistivity of less than approximately $1\times10^{-7}$ ohm meters at approximately 20° C. In certain embodiments, an electrically conductive material may have an electrical resistivity of less than approximately $3\times10^{-8}$ ohm meters at approximately 20° C.

Additionally, individual patches may be separated from one another so that each patch is electrically isolated from the other patches. That is, the respective physical separations between the patches may impede the flow of electricity between adjacent patches. The physical separation of certain patches may result from the overlapping of shield segments. In certain embodiments, such as embodiments in which a plurality of patches are formed on a single shield element segment, the physical separation of other patches may be formed by gaps or spaces, such as gaps of dielectric material. The respective physical separations between the patches may impede the flow of electricity between adjacent patches. Additionally, in certain embodiments, one or more of the electrically conductive patches may span fully across a shield 120 in the longitudinal direction, which may permit the circumferential shorting of the patches.

The components of a shield element or various segments of a shield element may include a wide variety of suitable dimensions, for example, any suitable lengths in the longitudinal direction and/or any suitable thicknesses. A dielectric portion included in a shield element or segment may have any desired thickness, such as a thickness of about 1 to about 5 mils (thousandths of an inch) or about 25 to about 125 microns. Additionally, each electrically conductive patch may include a coating of metal (or other material) having any desired thickness, such as a thickness of about 0.5 mils (about 13 microns) or greater. In many applications, signal performance benefits from a thickness that is greater than about 2 mils, for example in a range of about 2.0 to about 2.5 mils, about 2.0 to about 2.25 mils, about 2.25 to about 2.5 mils, about 2.5 to about 3.0 mils, or about 2.0 to about 3.0 mils. Indeed, with a thickness of less than about 1.5 mils, negative insertion loss characteristics may be present on the cable 100.

In certain embodiments, an electrically conductive patch may cover substantially an entire area of a shield element segment (e.g., substantially the entire surface on one side of a carrier layer, etc.). In other embodiments, a plurality of electrically conductive patches may be formed on a segment and/or a relatively continuous shield element. A wide variety of segment and/or patch lengths (e.g., lengths along a longitudinal direction of the cable 100) may be utilized. As desired, the dimensions of the segments and/or electrically conductive patches can be selected to provide electromagnetic shielding over a specific band of electromagnetic frequencies or above or below a designated frequency threshold. In certain embodiments, each segment and/or patch may have a length of about one meter to about one hundred meters, although lengths of less than one meter (e.g., lengths of about 1.5 to about 2 inches, etc.) may be utilized. For example, the segments and/or patches may have a length in a range of about one to ten meters. In various embodiments, the segments and/or patches can have a length of about 0.5, 0.75, 1.0, 1.5, 2.0, 2.5, 3.0, 3.5, 4.0, 4.5, or 5.0 meters or in a range between any two of these values;

In one example embodiment, segments and/or patches of electrically conductive material may be between approximately two and five meters in length, although other suitable lengths may be utilized such as lengths up to 100 meters or lengths smaller than two meters. In the event that the patches are approximately two meters in length or greater, a return loss spike for the cable may be formed within the operating frequency of the cable. However, the amplitude of the return loss spike may satisfy electrical performance requirements for the cable (i.e., fall within acceptable limits), thereby permitting higher signal frequencies to be supported by the cable. In the event that smaller patches are utilized, a return loss spike may be shifted outside of the operating range of the cable.

In the event that a plurality of patches is formed on a relatively continuous shield element or a shield element segment, a wide variety of suitable gap distances or isolation gaps may be provided between adjacent patches. For example, the isolation spaces can have a length of about 0.5, 1.0, 1.5, 2.0, 2.5, 3.0, 3.5, or 4 millimeters or in a range between any two of these values. In one example embodiment, each patch may be at least two meters in length, and a relatively small isolation gap (e.g., 4 millimeters or less, about 1/16 of an inch, etc.) may be formed between adjacent patches. Additionally, the patches may be formed as first patches (e.g., first patches on a first side of a dielectric material), and second patches may be formed on an opposite side of the dielectric material (or on another dielectric material). For example, second patches may be formed to correspond with the gaps or isolation spaces between the first patches. As desired, the electrically conductive patches may have a wide variety of different shapes and/or orientations. For example, the segments and/or patches may have a rectangular, trapezoidal, or parallelogram shape. A few example shapes for patches are described in greater detail below with reference to FIGS. 7A-7D.

In certain embodiments, shield element segments and/or electrically conductive patches may be formed to be approximately perpendicular (e.g., square or rectangular segments and/or patches) to the longitudinal axis of the adjacent one or more pairs 105 (e.g., pairs enclosed by a shield, pairs adjacent to a separator, etc.). In other embodiments, the segments and/or patches may have a spiral direction that is opposite the twist direction of the enclosed one or more pairs 105. That is, if the twisted pair(s) 105 are twisted in a clockwise direction, then the segments and/or patches may spiral in a counterclockwise direction. If the twisted pair(s) 105 are twisted in a counterclockwise direction, then the conductive patches may spiral in a clockwise direction. Thus, twisted pair lay opposes the direction of the segment and/or patch spiral. The opposite directions may provide an enhanced level of shielding performance. In other embodiments, the segments and/or patches may have a spiral direction that is the same as the twist direction of the enclosed one or more pairs 105.

As desired in various embodiments, a wide variety of other materials may be incorporated into the cable 100. For example, as set forth above, the cable 100 may include any number of conductors, twisted pairs, optical fibers, and/or other transmission media. As another example, as illustrated in FIGS. 2 and 3, one or more respective dielectric films or other suitable components may be positioned between the individual conductors of one or more of the twisted pairs 105. In certain embodiments, one or more tubes or other structures may be situated around various transmission media and/or groups of transmission media. Additionally, as desired, a cable may include a wide variety of strength members, swellable materials (e.g., aramid yarns, blown swellable fibers, etc.), insulating materials, dielectric materials, flame retardants, flame suppressants or extinguishants, gels, and/or other materials. The cable 100 illustrated in FIG. 1 is provided by way of example only. Embodiments of the disclosure contemplate a wide variety of other cables and cable constructions. These other cables may include more or less components than the cable 100 illustrated in FIG. 1. Additionally, certain components may have different dimensions and/or materials than the components illustrated in FIG. 1.

FIG. 2 is a cross-sectional view of another example cable 200 including at least one shield element, according to an illustrative embodiment of the disclosure. The cable 200 of FIG. 2 may include components that are similar to the cable 100 illustrated and described above with reference to FIG. 1. Accordingly, the cable 200 may include a plurality of twisted pairs 205A-D disposed in a cable core. A separator 210 may be disposed between at least two of the twisted pairs 205A-D and may function to orient and/or provide desired spacing between two or more of the twisted pairs 205A-D.

With continued reference to FIG. 2, an outer jacket 215 may enclose the internal components of the cable 200. Additionally, a shield layer 220 may optionally be incorporated into the outer jacket 215. In certain embodiments, the shield layer 220 may be sandwiched between two other layers of outer jacket material, such as two dielectric layers. The layers of jacket material that sandwich the shield layer 220 may be formed of similar materials or, alternatively, of different materials. Further, a wide variety of suitable techniques may be utilized to bond or adhere the shield layer 220 to the other layers of the jacket 215. In other embodiments, electrically conductive material may be injected or inserted into the outer jacket 215. In yet other embodiments, the outer jacket 215 may be impregnated with electrically conductive material. In yet other embodiments, the cable 100 may not include an outer shield layer 220.

Additionally, as desired in certain embodiments, each of the twisted pairs 205A-D may be individually shielded. For example, shield layers 225A-D may respectively be wrapped or otherwise formed around each of the twisted pairs 205A-D. In other words, a first shield layer 225A may be formed around a first twisted pair 205A, a second shield layer 225B may be formed around a second twisted pair 205B, a third shield layer 225C may be formed around a third twisted pair 205C, and a fourth shield layer 225D may be formed around a fourth twisted pair 205D. In other embodiments, a portion or none of the twisted pairs may be individually shielded. Indeed, a wide variety of different shielding arrangements may be utilized in accordance with various embodiments of the disclosure.

With continued reference to FIG. 2, in certain embodiments, respective dielectric separators 230A-D may be woven helically between the individual conductors or conductive elements of one or more of the twisted pairs 205A-D. In other words, a dielectric separator (generally referred to as dielectric separator 230) may be helically twisted with the conductors of a twisted pair 205 along a longitudinal length of the cable 200. In certain embodiments, the dielectric separator 230 may maintain spacing between the individual conductors of the twisted pair 205 and/or maintain the positions of one or both of the individual conductors. For example, the dielectric separator 230 may be formed with a cross-section (e.g., an X-shaped cross-section, an H-shaped cross-section, etc.) that assists in maintaining the position(s) of one or both the individual conductors of the twisted pair 205. In other words, the dielectric separator 230 may reduce or limit the ability of one or both of the individual conductors to shift, slide, or otherwise move in the event that certain forces, such as compressive forces, are exerted on the cable 200. As illustrated in FIG. 2, in other embodiments, a dielectric separator 230 may be formed as a relatively simple film layer that is positioned between the individual conductors of a twisted pair 205.

Additionally, in certain embodiments, a dielectric separator 230 may include one or more portions that extend beyond an outer circumference of a twisted pair 205. When the individual conductors of a twisted pair 205 are wrapped together, the resulting twisted pair 205 will occupy an approximately circular cross-section along a longitudinal length of the cable 200, although the cross-section of the twisted pair 205 is not circular at any given point along the longitudinal length. In certain embodiments, a dielectric separator 230 may extend beyond the outer circumference formed by the twisted pair 205. In this regard, the dielectric separator 230 may maintain a desired distance between the twisted pair 205 and a shield layer, such as shield layer 225. Thus, when the shield layer 225 is formed around the twisted pair 205, a circumference of the shield layer 225 will be greater than that of the twisted pair 205.

FIG. 3 is a cross-sectional view of another example cable 300 including at least one shield element, according to an illustrative embodiment of the disclosure. The cable 300 of FIG. 3 may include components that are similar to the cables 100, 200 illustrated and described above with reference to FIG. 1 and. Accordingly, the cable 300 may include a plurality of twisted pairs 305A-D disposed in a cable core. A separator 310 may be disposed between at least two of the twisted pairs 305A-D and may function to orient and/or provide desired spacing between two or more of the twisted pairs 305A-D.

The separator 310 illustrated in FIG. 3 has a different construction than the separators 110, 210 illustrated in FIGS. 1 and 2. In particular, the separator 310 is a generally T-shaped separator that approximately bisects (or otherwise divides) the cable core and forms two channels along a longitudinal length of the cable 300 in which the twisted pairs 305A-D are disposed. For example, two twisted pairs 305A, 305B can be disposed in a first channel and the remaining two twisted pairs 305C, 305D can be disposed in a second channel. The T-shaped separator 310 illustrated in FIG. 3 is merely one example of an alternative separator shape, and a wide variety of other separator shapes may be utilized as desired.

With continued reference to FIG. 3, an outer jacket 315 may enclose the internal components of the cable 300. Additionally, any number of shield layers may be utilized to provide shielding for the twisted pairs 305A-D. For example, a first shield layer 320 may be wrapped or otherwise formed around two of the twisted pairs, such as the twisted pairs 305A, 305B disposed in the first channel. A second shield layer 325 may be wrapped or otherwise formed around other twisted pairs, such as twisted pairs 305C, 305D disposed in the second channel. In other words, shield layers may be provided for various groups of twisted pairs disposed within the cable core.

Additionally, respective dielectric separators 330A-D having an H-shaped cross-section are illustrated in FIG. 3 as being disposed or positioned between the individual conductors of the various twisted pairs 305A-D. As described in greater detail above with reference to FIG. 2, these dielectric separators 330A-D may assist in maintaining the position(s) of one or both the individual conductors of the twisted pairs 305A-D.

Similar to the cable 100 illustrated in FIG. 1, the cables 200, 300 illustrated in FIGS. 2 and 3 are provided by way of example only. Embodiments of the disclosure contemplate a wide variety of other cables and cable constructions. These other cables may include more or less components than the cables 200, 300 illustrated in FIGS. 2 and 3. For example, other cables may include alternative shielding arrangements and/or different types of separators or fillers. Additionally, certain components may have different dimensions and/or materials than the components illustrated in FIGS. 2 and 3.

Figure 4A:
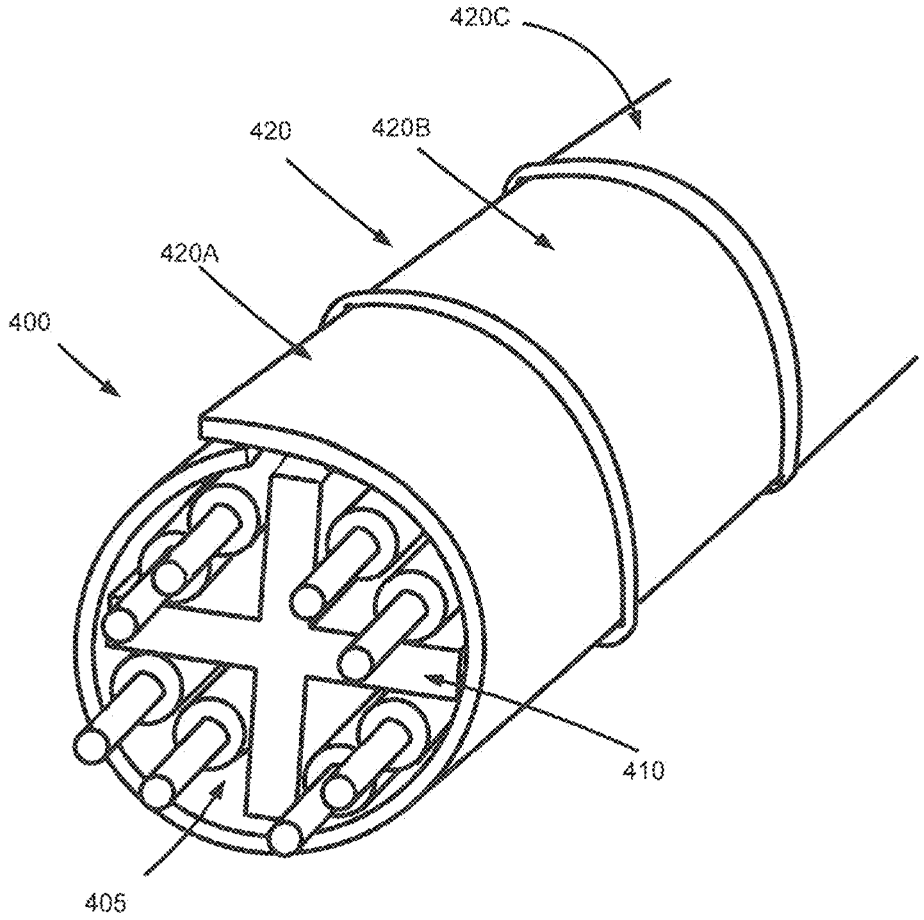
FIG. 4A illustrates a perspective view of an example cable including a segmented shield formed from overlapping segments, according to an illustrative embodiment of the disclosure.

As set forth above, in certain embodiments, a shield layer may be formed to include a plurality of longitudinally overlapping segments, and each segment may include one or more discontinuous electrically conductive patches. FIG. 4A illustrates a perspective view of an example cable 400 including a segmented shield, according to an illustrative embodiment of the disclosure. The cable 400 may include components that are similar to the cables 100, 200, 300 illustrated in FIGS. 1-3.

With reference to FIG. 4A, the cable 400 may include any number of transmission media situated within a cable core. As illustrated, the cable 400 may include four twisted pairs 405, although other transmission media or combinations of transmission media may be utilized. As desired in certain embodiments, a separator 410 or filler may be positioned between two or more of the twisted pairs 405. Additionally, one or more shields may be incorporated into the cable 400. As shown in FIG. 4A, an overall shield 420 may be formed around the four twisted pairs 405. In other embodiments, a twisted pair may be individually shielded and/or desired subgroups of twisted pairs may be shielded.

According to an aspect of the disclosure, the shield 420 may be formed from a plurality of longitudinally extending discrete segments, such as segments 420A, 420B, 420C. Each segment 420A, 420B, 420C may include one or more patches of electrically conductive material, such as metallic patches formed on a suitable carrier or substrate layer. Further, an overlap may be formed between each adjacent shield segment 420A, 420B, 420C. For example, a first shield segment 420A may be formed around the twisted pairs 405, and the first shield segment 420A may include a first end and a second end along a longitudinal direction of the cable 400. A second shield segment 420B may be formed around the twisted pairs 405, and the second shield segment 420B may also include a first end and a second end. The first end of the second shield segment 420B may overlap the second end of the first shield segment 420A. As desired, a third shield segment 420C may also be formed around the twisted pairs 405, and a first end of the third shield segment 420C may overlap the second end of the second shield segment 420B. Any number of other shield segments may be formed in a similar manner.

Other segment overlapping configurations may be utilized as desired in various embodiments. For example, both the first segment 420A and the third segment 420C may overlap the second segment 420B. Indeed, a wide variety of overlapping configurations is possible and will be appreciated by those of ordinary skill in the art.

In certain embodiments, individual shield segments 420A-C may be separately wrapped around the twisted pairs 405 such that adjacent shield segments overlap one another. In other words, individual shield segments may be incorporated into a cable during cable construction. In other embodiments, a shield 420 may be formed from a plurality of overlapping segments 420A-C, and the formed shield 420 may be wrapped around the twisted pairs 405. For example, individual segments may be combined in an overlapping fashion, and the resulting shield may then be incorporated into a cable during cable construction.

The cable 400 illustrated in FIG. 4A may include a wide variety of other components as desired in various embodiments. For example, the cable 400 may include an outside jacket that is formed over the shield 420. As another example, the cable 400 may include any combination of the example components described above with reference to FIGS. 1-3.

Figure 4B:
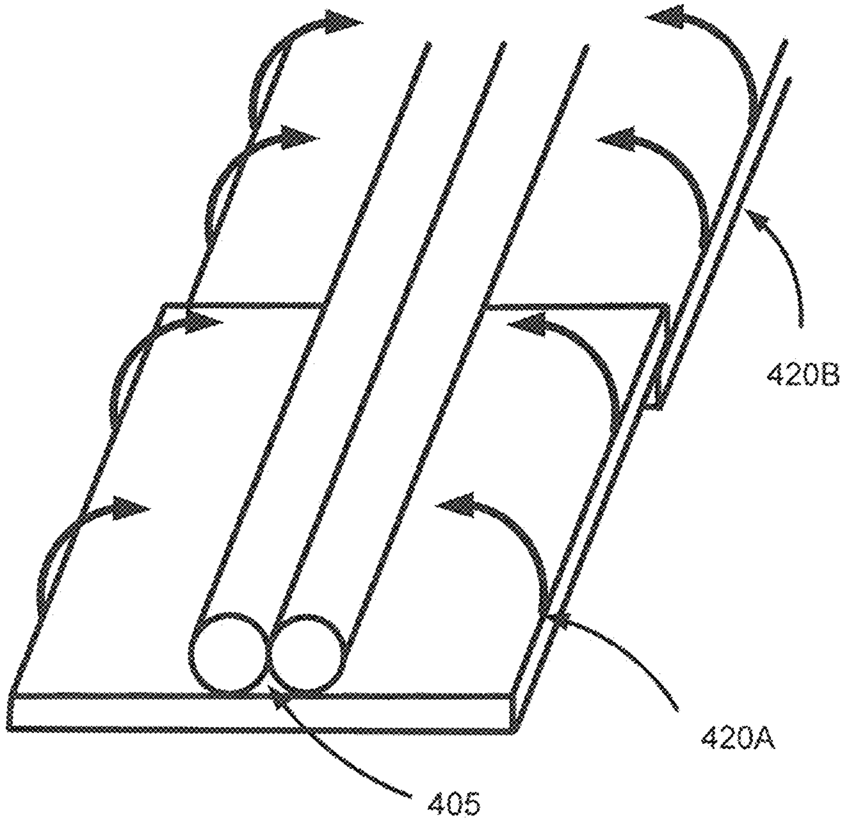
FIG. 4B illustrates an example technique for wrapping one or more twisted pairs with a segmented shield formed from overlapping segments, according to certain embodiments of the disclosure.

A wide variety of suitable techniques may be utilized as desired to wrap one or more twisted pairs with a shield layer. FIG. 4B illustrates one example technique for wrapping one or more twisted pairs 405, which may be similar to the twisted pairs 105 illustrated in FIG. 1, with a shield layer 420, which may be similar to the shield 120 illustrated in FIG. 1. With reference to FIG. 4B, in certain embodiments, one or more twisted pairs 405 may be positioned adjacent to a shield layer 420 (e.g., a shield layer formed from a plurality of overlapping segments). In other embodiments, one or more twisted pairs 405 may be positioned adjacent to one or more shield layer segments, such as segments 420A and 420B. The twisted pair(s) 405 may extend essentially parallel with the major or longitudinal axis/dimension of the shield layer 420 or the segment(s). Thus, the twisted pair(s) 405 can be viewed as being parallel to the surface or plane of the shield layer 420 of segment(s). As desired, the twisted pair(s) 405 may be approximately centered along a width dimension of the shield layer 420 or segment(s). Alternatively, the twisted pair(s) 405 may be positioned closer to one edge of the shield layer 420 or segment(s).

In certain applications, two conductors, which are typically individually insulated, will be twisted together to form a twisted pair 405. The shield layer 420 and/or various individual segments may then be wrapped around the twisted pair. Alternatively, the shield layer 420 and/or various segments may be wrapped around multiple twisted pairs of conductors, such as twisted pairs that have been twisted, bunched, or cabled together. For example, during wrapping, one edge (or both edges) of the shield layer 420 (e.g., the distal edge opposite the edge at which the twisted pair(s) 405 is positioned) may be brought up over the twisted pair(s) 405, thereby encasing the twisted pair(s) 405 or wrapping the shield layer 420 around or over the twisted pair(s) 405. In an example embodiment, the motion can be characterized as folding or curling the shield layer over the twisted pair(s) 405.

In embodiments in which individual shield segments are wrapped around the twisted pair(s) 405, the individual segments may be wrapped so as to overlap one another. For example, a first shield segment 420A may be wrapped around the twisted pair(s) 405. A second shield segment 420B may then be wrapped around the twisted pairs 205, and the second shield segment 420B may overlap the first shield segment 420A at one end or edge. As desired, a third shield segment 420C may also be wrapped around the twisted pair(s) 405, and the third shield segment 420C may overlap the second shield segment 420B. Any number of other shield segments may be wrapped around the twisted pair(s) 405 in a similar manner.

In certain embodiments, the shield layer 420 (or individual shield layer segments) may be wrapped around the twisted pair(s) 405 without substantially spiraling the shield layer 420 around or about the twisted pair(s) 405. Alternatively, the shield layer 420 (or individual shield layer segments) may be wrapped so as to spiral around the twisted pair(s) 405. Additionally, in certain embodiments, the conductive patches included in the shield layer 420 may face away from the twisted pair(s) 405, towards the exterior of a cable. In other embodiments, the conductive patches may face inward, towards the twisted pair(s) 405. In yet other embodiments, conductive patches may be formed on both sides of the shield layer 420.

In one example embodiment, a shield layer 420 and the twisted pair(s) 405 are continuously fed from reels, bins, containers, or other bulk storage facilities into a narrowing chute or a funnel that curls the shield layer over the twisted pair(s). In certain embodiments, a relatively continuous shield layer 420 (e.g., a shield layer that has been pre-formed to include overlapping segments) may be incorporated into a cable. In other embodiments, a shield layer material (e.g., a tape, etc.) may be cut as it is incorporated (or prior to incorporation) into a cable so as to facilitate the formation of overlapping segments. In yet other embodiments, multiple sources of shield layer material may be provided. Downstream from the mechanism(s) (or as a component of this mechanism) that feed cable core components, a nozzle or outlet port can extrude a polymeric jacket, skin, casing, or sheath over the shield layer 420, thus providing the basic architecture depicted in FIGS. 1-3 and discussed above.

In certain embodiments, one or more of the electrically conductive patches included in a shield, such as shield 120, may be shorted in a circumferential direction or along a periphery of the enclosed cable components. In other words, an electrically conductive patch may contact itself at the edges of a shield (or at any other desired point(s)) once the shield is wrapped around one or more twisted pairs (and/or other cable components). A wide variety of suitable methods or techniques may be utilized to electrically short patches in a circumferential direction. FIGS. 5A-5D illustrate a few example techniques for creating electrically shorted patches within a shield, according to illustrative embodiments of the disclosure.

Figure 5A:
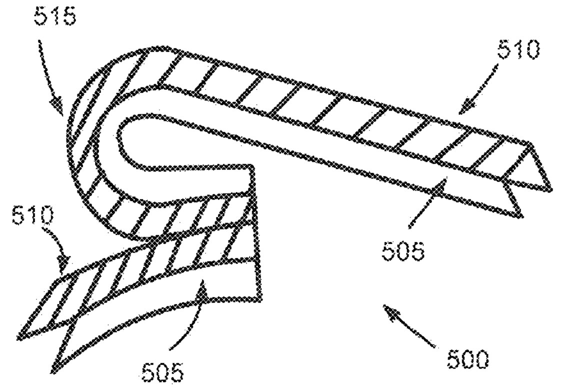
FIGS. 5A-5D illustrate example techniques for creating electrically shorted patches within a shield, according to illustrative embodiments of the disclosure.

With reference to FIG. 5A, a first example shield 500 and associated overlap portion (i.e., portion at which the shield 500 overlaps itself when wrapped around one or more cable components) is illustrated. The illustrated shield 500 may include a dielectric material 505, and one or more electrically conductive patches 510 may be formed on the dielectric material 505. A fold 515 may be formed at or near one edge of the shield 500. In other words, the shield 500 may be folded over itself along one edge (e.g., an edge in the width direction) or along one or more portions of one edge (e.g., portions of an edge corresponding to electrically conductive patches). Accordingly, when the shield 500 is wrapped around one or more twisted pairs (and/or other cable components) and brought into contact with itself within an overlapping region, the patch material at one edge of the shield 500 will be brought into contact with the patch material at or near the opposing edge of the shield 500.

Figure 5B:
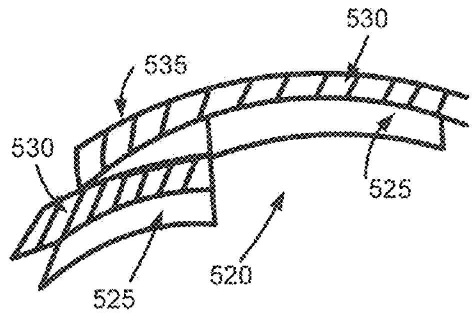

FIG. 5B illustrates another example shield 520 and associated overlap portion. The shield 520 may include a dielectric material 525, and one or more electrically conductive patches 530 may be formed on the dielectric material 525. Along one edge of the shield 520, an overhanging portion 530 may be formed in which electrically conductive patch material extends beyond the dielectric material 525. A wide variety of suitable techniques may be utilized as desired to form the overhanging portion 530. For example, the dielectric material 525 may be removed from one edge (or a portion of one edge) of the shield 520. As another example, one or more electrically conductive patches 530 may be formed on or attached to the dielectric material 525 so as to overhang or extend beyond one edge (or one or more portions of one edge) of the dielectric material 525. Accordingly, when the shield 520 is wrapped around one or more twisted pairs (and/or other cable components) and brought into contact with itself, the two edges (or a first edge and another portion) of an electrically conductive patch 530 will be brought into contact with one another, thereby creating an electrically shorted patch.

Figure 5C:
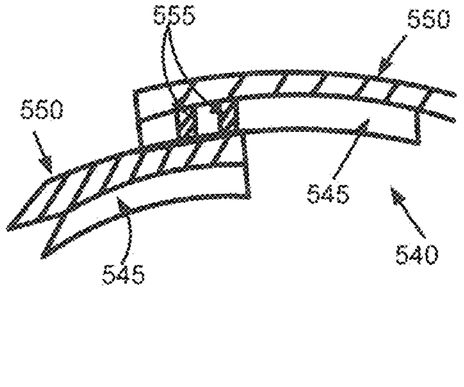

FIG. 5C illustrates another example shield 540 and associated overlap portion in which electrically shorted patches may be formed. The shield 540 may include a dielectric material 545, and one or more electrically conductive patches 550 may be formed on the dielectric material 545. Along one edge of the shield 540 (or at any other desired areas within the overlap portion), one or more vias 555 (e.g., metallic or electrically conductive vias, etc.) may be provided in the dielectric material 545 to permit two portions of a patch 550 to be brought into contact. Although not specifically illustrated, in other embodiments, one or more gaps or holes may be formed in the dielectric material 545. Thus, when wrapped around one or more twisted pairs (and/or other cable components), one edge of an electrically conductive patch may be permitted to contact another edge of the patch via the one or more gaps or holes.

Figure 5D:
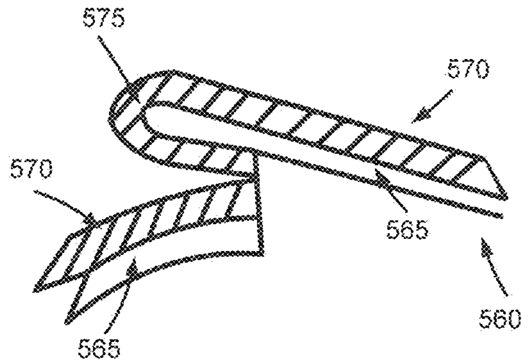

FIG. 5D illustrates another example shield 560 and associated overlap portion in which electrically shorted patches may be formed. The shield 560 may include a dielectric material 565, and one or more electrically conductive patches 570 may be formed on the dielectric material 565. A patch 570 may include an overlapping or double-sided portion 575 at one edge (or at one or more portions of one edge) of the shield 560. For example, the patch 570 may be folded over one edge of the dielectric material 565. As another example, the patch 570 may be formed on both sides of the dielectric material 565 along one edge (or at one or more portions of one edge) of the shield 560. In other words, at one edge of the shield 560, an electrically conductive patch 570 may be present on both sides of the dielectric material 565. Accordingly, when the shield 560 is wrapped around one or more twisted pairs (and/or other cable components) and brought into contact with itself, the patch 570 will be electrically shorted.

A wide variety of other suitable methods and/or techniques may be utilized as desired to form shield layers including discontinuous patches that are electrically shorted in the circumferential direction. For example, in certain embodiments, one or more discontinuous patches may be formed along a length of the cable without a carrier tape or other substrate. For example, during formation of a cable, a plurality of discontinuous patches may be wrapped or otherwise formed around one or more twisted pairs or other transmission media. Any number of suitable techniques may be utilized as desired to hold the patches in place. For example, an adhesive (e.g., a contact adhesive, a pressure sensitive adhesive, a hot melt adhesive) may be applied to a patch in order to adhere the patch to the transmission media, an inner surface of an outside cable jacket, and/or to any other desired components of a cable (e.g., an armor layer, a water-blocking layer, a tube, etc.).

Figure 6A:
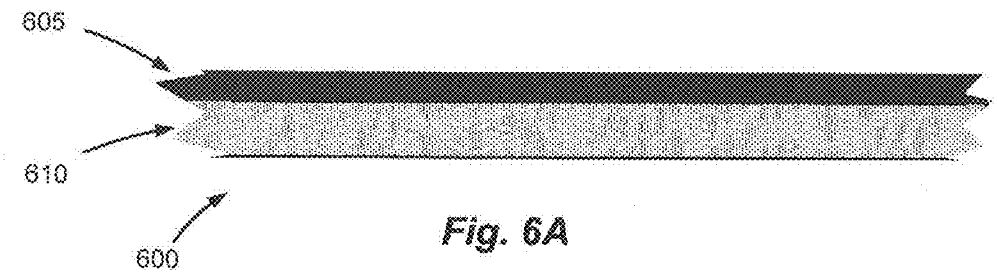
FIGS. 6A-6C illustrate example cross-sections for various shielding elements that may be utilized to in accordance with various embodiments of the disclosure.
Figure 6B:
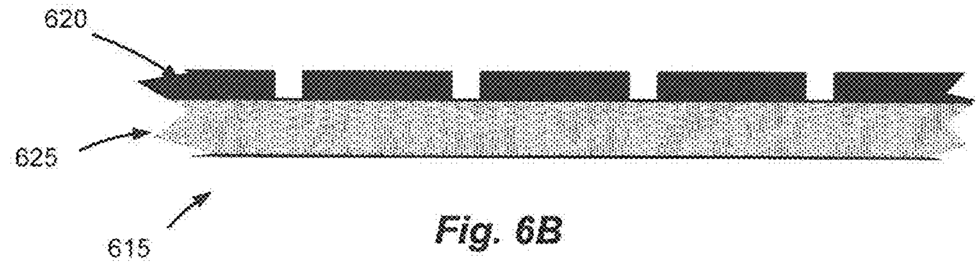

FIGS. 6A-6B illustrate cross-sections for example shield elements and/or shield element segments that may be utilized in accordance with various embodiments of the disclosure, such as the shield 120 or separator 110 illustrated in FIG. 1. FIG. 6A illustrates an example segment 600 that may be utilized in a shield element. In certain embodiments, the segment 600 may be formed as a tape or other configuration including a substrate or carrier layer with electrically conductive material formed on the substrate. The segment 600 may include a dielectric layer 610, and an electrically conductive layer 605 may be formed or disposed on one side of the dielectric layer 610. As shown, the electrically conductive layer 605 may cover substantially all of one side of the dielectric layer 610.

FIG. 6B illustrates an example shield element 615 (or segment utilized to form a shield element) in which an electrically conductive layer 620 is formed on a dielectric layer 625. The electrically conductive layer may include a plurality of patches of electrically conductive material, and gaps or spaces may exist in a longitudinal direction between adjacent patches. As desired, additional patches of electrically conductive material may be formed on an opposite side of the dielectric layer 610 to cover gaps between adjacent patches.

Figure 6C:
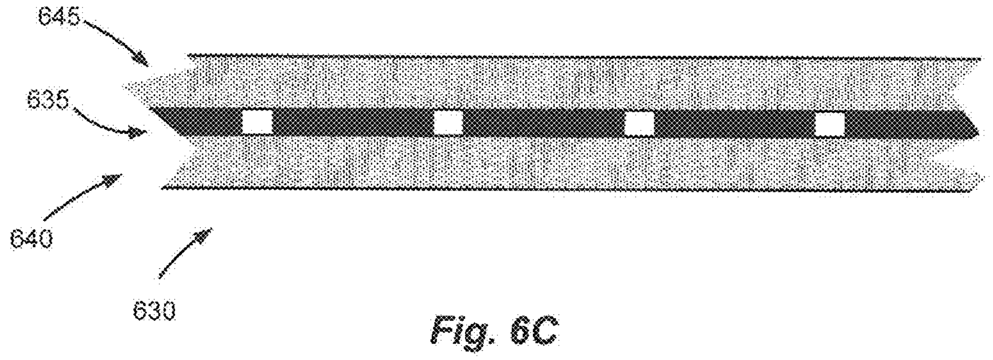

FIG. 6C illustrates another example shield element 630 (or segment utilized to form a shield element) in which an electrically conductive layer 635 is sandwiched between two dielectric layers 640, 645. A wide variety of other constructions may be utilized as desired to form a shield element or segment in accordance with various embodiments of the disclosure. Indeed, any number of dielectric and electrically conductive layers may be utilized. The shield elements and/or segments 600, 615, 630 illustrated in FIGS. 6A-6C are provided by way of example only.

Figure 7A:
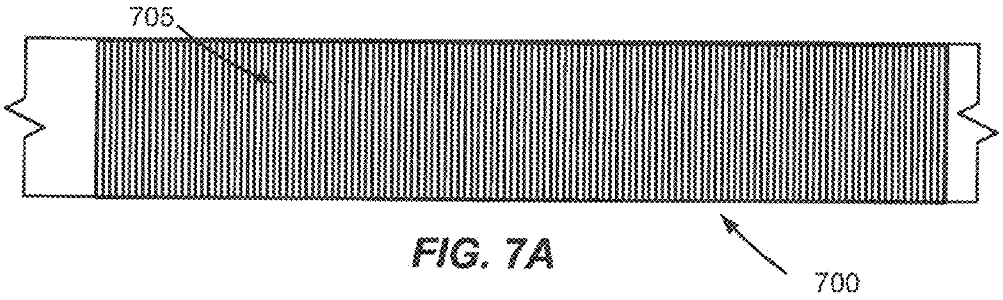
FIGS. 7A-7D illustrate example electrically conductive patch configurations that may be utilized in conjunction with shielding elements in various embodiments of the disclosure.

FIGS. 7A-7D illustrate example electrically conductive patch configurations that may be utilized in conjunction with shielding elements and/or segments of shielding elements in accordance with various embodiments of the disclosure. With reference to FIG. 7A, a top level (or bottom level) view of an example shield element segment 700 is illustrated. The segment 700 may include a relatively continuous electrically conductive patch 705 formed on a dielectric material. The patch 705 may cover all or substantially all of one side of the dielectric material. As a result, the segment 700 may be incorporated into an overlapping discontinuous shield element. Additionally, in certain embodiments, when the segment 700 is incorporated into a shield element, the patch 705 may be circumferentially shorted utilizing any number of the techniques described herein.

Figure 7B:
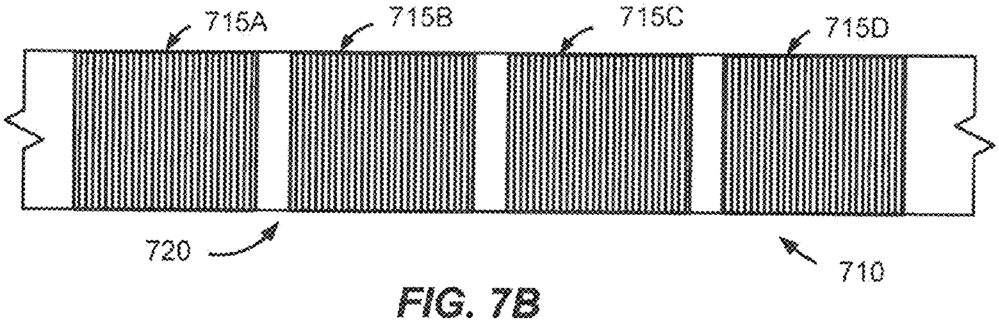

With reference to FIG. 7B, a top level (or bottom level) view of an example shield element 710 (or segment utilized to form a shield element) is illustrated. The shield element 710 may include any number of rectangular patches of electrically conductive material, such as patches 715A-D, formed on a dielectric material. As desired in various embodiments, the patches 715A-D may include any desired lengths (e.g., approximately 2 meters, etc.), and any desired gap 720 or separation distance may be provided between adjacent patches. In certain embodiments, the patches may be formed in accordance with a repeating pattern having a definite step or period. As desired, additional patches may be formed on an opposing side of the dielectric material to cover the gaps 720. Additionally, in certain embodiments, each patch 715A-D may have a width that extends from one edge of the shield element 710 to an opposing edge of the shield element 710. Thus, in certain embodiments, when the shield element 710 is wrapped around one or more transmission media, the patches 715A-D may be circumferentially shorted utilizing any number of the techniques described herein.

Figure 7C:
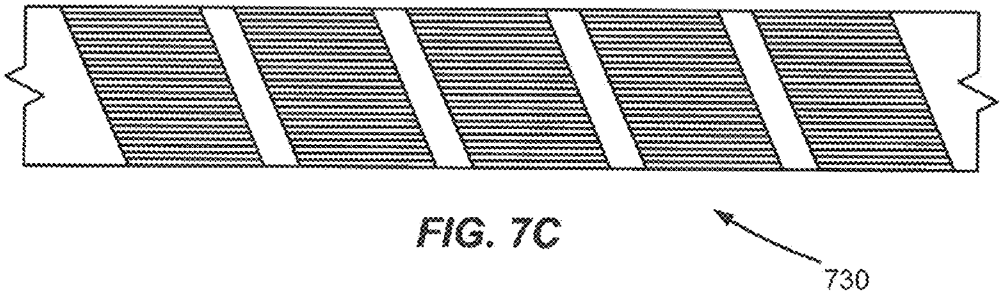

FIG. 7C illustrates a top level (or bottom level) view of another example shield element 730 (or segment utilized to form a shield element). The shield element 730 may include any number of electrically conductive patches having the shape of a parallelogram. In other words, the patches may be formed at an angle along the shield segment. As shown, the patches may be formed at an acute angle with respect to the width dimension of the tape. In certain embodiments, the acute angle facilitates manufacturing and enhances patch-to-substrate adhesion. Additionally, the acute angle may also facilitate the covering of opposing isolating spaces or gaps. For example, the acute angle results in the isolating spaces being oriented at a non-perpendicular angle with respect to the pairs and the longitudinal axis of the cable. If any manufacturing issue results in part of the isolating spaces not being completely covered (e.g., by a conductive patch on an opposite tape side), such an open area will likewise be oriented at a non-perpendicular angle with respect to the pairs. Such an opening will therefore spiral about the pairs, rather than circumscribing a single longitudinal location of the cable. Such a spiraling opening is believed to have a lesser impact on shielding than would an opening circumscribing a single longitudinal location. In other words, an inadvertent opening that spirals would allow less unwanted transmission of electromagnetic interference than a non-spiraling opening. In certain embodiments, benefit is achieved when the acute angle is about 45 degrees or less. In other embodiments, benefit is achieved when the acute angle is about 35 degrees or less, about 30 degrees or less, about 25 degrees or less, about 20 degrees or less, or about 15 degrees or less. In other embodiments, benefit is achieved when the acute angle is between about 12 and 40 degrees. In certain embodiments, the acute angle may be in a range between any two of the degree values provided in this paragraph.

Figure 7D:
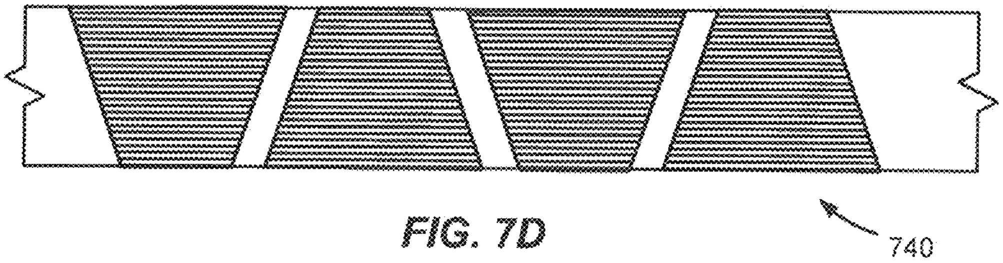

FIG. 7D illustrates a top level (or bottom level) view of another example shield element 740 (or segment utilized to form a shield element). The shield element 740 may include any number of electrically conductive patches having a trapezoidal shape. In certain embodiments, the orientation of adjacent trapezoidal patches may alternate. Similar to the patch pattern illustrated in FIG. 7C, the trapezoidal patches may provide manufacturing and/or shielding benefits. A wide variety of other suitable patch configurations may be utilized as desired in various embodiments.

As set forth above, a separator (e.g., separator 110 illustrated in FIG. 1) may be formed with a wide variety of suitable cross-sectional shapes. FIGS. 8A-8L illustrate cross-sectional views of example separators that may be utilized in accordance with various embodiments of the disclosure. In certain embodiments, a separator may be molded or formed from dielectric material and, as desired, electrically conductive material may be combined (e.g., deposited onto, incorporated into, adhered to, etc.) with the dielectric material. In other embodiments, a dielectric tape, which may include electrically conductive material, may be formed into a desired shape to be utilized as a separator.

Figure 8A:
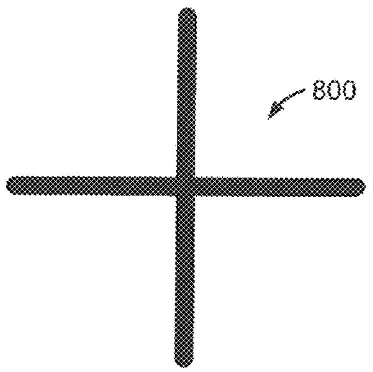
FIGS. 8A-8L illustrate example cross-sections for separators or separation fillers that may be utilized in accordance with various embodiments of the disclosure.

FIG. 8A illustrates an example separator 800 having a cross, plus, or X-shape. The separator 800 may form four channels, and a respective twisted pair may be positioned within each channel. As shown, the separator 800 includes four fins extending from a central point. However, as desired in other embodiments, one or more of the fins may be offset from the central point. Additionally, as desired, one or more extensions (not shown) may extend laterally from the ends of one or more of the fins. The extensions may be configured to contact the outer jacket of a cable (or any intermediate shielding or other layer) and may assist in holding the separator 800 in place.

Figure 8B:
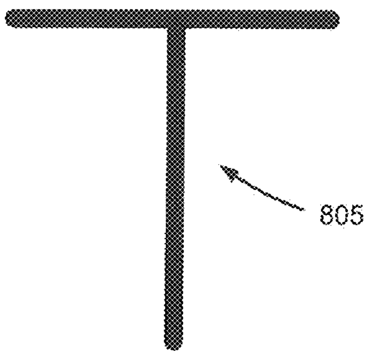

FIG. 8B illustrates an example separator 805 having a T-shape. The separator 805 may include a first portion or segment that bisects (or otherwise divides) a cable core, thereby forming two channels in which twisted pairs are disposed. For example, two twisted pairs can be disposed in a first channel and an additional two twisted pairs can be disposed in a second channel. Additionally, the separator 805 may include a second portion connected at one end of the first portion at an approximately 90 degree angle. In certain embodiments, the first portion may contact the second portion at an approximate midpoint of the second portion. In other embodiments, the connection may be offset from a midpoint of the second portion. Additionally, as desired, the first portion may extend through the second portion any desired distance. The second portion may be configured to contact the outer jacket of a cable (or any intermediate shielding or other layer) and may assist in holding the separator 805 in place.

Figure 8C:
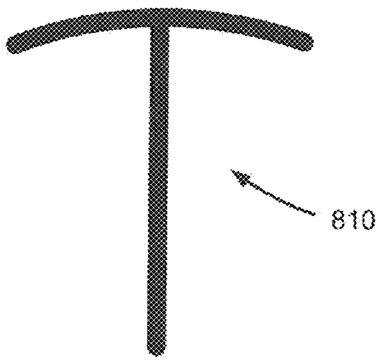
Figure 8D:
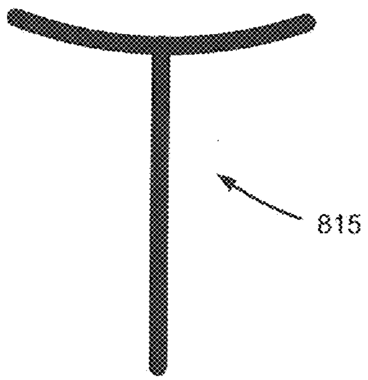

FIG. 8C illustrates an example separator 810 having a first segment that bisects (or otherwise divides) a cable core and a second segment having a concave shape. Similar to the separator 805 illustrated in FIG. 8B, the first segment may form two channels in which twisted pairs are disposed. The second segment may be connected to the first segment, and the second segment may be configured to contact the outer jacket of a cable (or an intermediate layer) in order to hold the separator 810 in place. FIG. 8D illustrates another example separator 815 similar to the separators 805, 810 illustrated in FIGS. 8B and 8C. However, the separator 815 of FIG. 8D has a second portion with a convex shape. The convex second portion may be configured to hold the separator 815 in place as it contacts an outer jacket (or intermediate layer) of a cable. Additionally, the convex second portion may initially create a separation or gap between portions of the separator 815 and the outer jacket. The separation or gap may be removed as the separator 815 is deformed during assembly (e.g., application of the outer jacket), storage, and/or installation of the cable, and the deformation may result in a tighter bond being formed between the separator 815 and outer jacket.

Figure 8E:
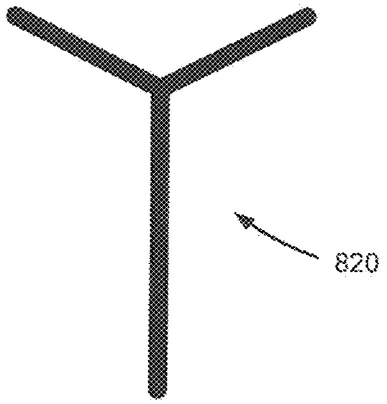

FIG. 8E illustrates an example separator 820 having a Y-shape. The separator 820 may include a first portion that bisects (or otherwise divides) a cable core, thereby forming two channels in which twisted pairs can be positioned. A second portion and a third portion may extend from one end (or from another desired point) of the first portion. The second and third portions may each extend at a desired angle in order to form the Y-shape separator 820. The opposite ends of the second and third portions may contact the outer jacket (or intermediate layer) of a cable, thereby assisting in holding the separator 820 in place. Additionally, the second and third portions may be deformed in a similar manner as that described above for the separator 815 of FIG. 8D.

Figure 8F:
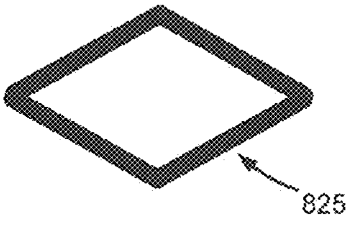
Figure 8G:
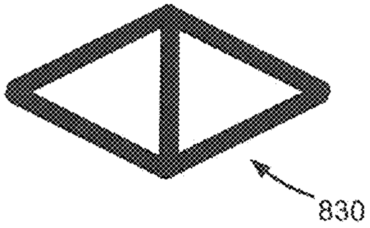

FIG. 8F illustrates an example separator 825 having a diamond shape. In certain embodiments, the separator 825 may be formed as a relatively solid separator. In other embodiments, the separator 825 may include one or more internal cavities filled with a gel or foam. In other embodiments, as illustrated by the separator 830 depicted in FIG. 8G, the separator 825 may include one or more ribs or support segments that assist the diamond in maintaining its shape. As desired, a diamond shape separator may include any number of gaps, holes, or spaces that may function to reduce the amount of material utilized to form the separator 825 and/or which may provide channels for additional components of a cable, such as a drain wire, an optical fiber, etc.

Figure 8H:
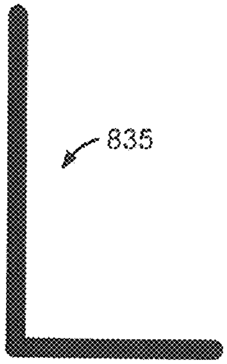

FIG. 8H illustrates an example separator 835 having an L-shape. The separator 835 may include a first portion or segment that bisects (or otherwise divides) a cable core, thereby forming two channels in which twisted pairs are disposed. Additionally, the separator 835 may include a second portion connected at one end of the first portion at an approximately 90 degree angle. The first portion may contact the second portion at one end of the second portion. The second portion may be configured to contact the outer jacket of a cable (or intermediate layer) and may assist in holding the separator 835 in place.

Figure 8I:
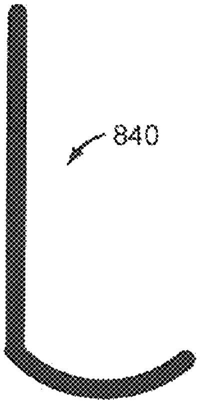

FIG. 8I illustrates an example separator 840 having a J-shape. The separator 840 illustrated in FIG. 8I is a variation of the L-shaped separator 835 illustrated in FIG. 8H; however, the second portion may have a concave curve configured to contact an outer jacket (or intermediate layer). As an alternative to a 3-shape separator, a second portion may have a convex shape configured to contact an outer jacket (or intermediate layer) of a cable.

Figure 8J:
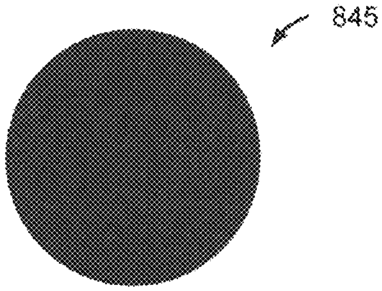
Figure 8K:
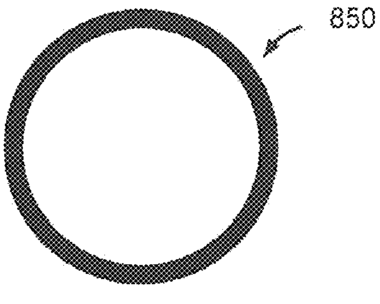

FIG. 8J illustrates an example separator 845 having a rod shape. The separator 845 may have a circular or elliptical cross-section. In certain embodiments, the separator 845 may be formed as a relatively solid separator. In other embodiments, as illustrated by the separator 850 illustrated in FIG. 8K, one or more internal cavities may be provided. As desired, these cavities may provide channels for additional cable components (e.g., a drain wire, an optical fiber, etc.) and/or a filling compound (e.g., gel, foam, etc.). In other embodiments, as one or more internal ribs or support segments may be provided inside an internal cavity to assist a separator in maintaining its shape and/or to provide multiple internal cavities.

Figure 8L:
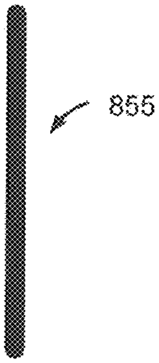

FIG. 8L illustrates an example separator 855 having a relatively flat shape. The separator 855 may be positioned between two or more of the twisted pairs of a cable. For example, the separator 855 may be positioned within the cable in order to bisect (or otherwise divide) a cable core, and two twisted pairs may be disposed on either side of the separator 855. In certain embodiments, the separator 855 may be a tape separator. In other embodiments, the separator 855 may be formed from any number of other materials. A wide variety of other dimensions and shapes may be utilized as desired to form a separator in accordance with embodiments of the disclosure. Additionally, as desired, twisted pairs may be adhered to a separator in order to maintain a desired separation distance.

Figure 9:
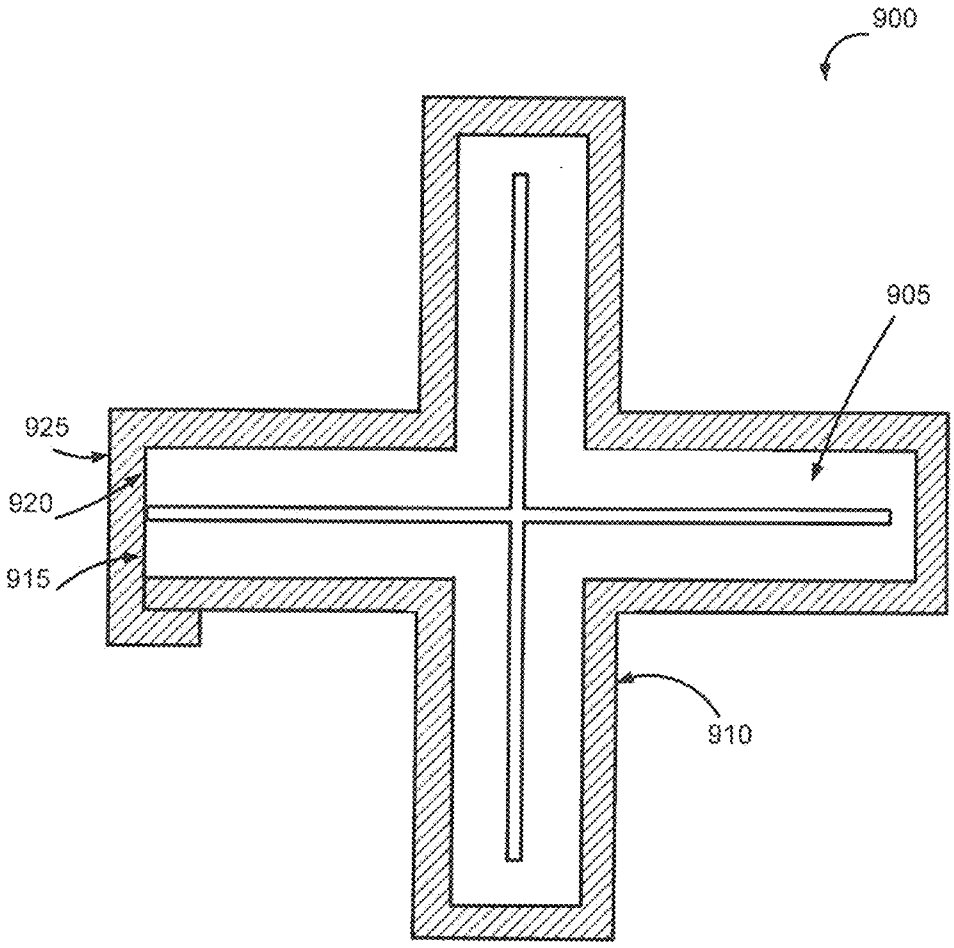
FIGS. 9-10 are cross-sectional views of example separators that have at least one electrically shorted patch of material, according to an illustrative embodiment of the disclosure.

In certain embodiments, a separator, such as separator 110 illustrated in FIG. 1, may be formed with at least one patch of electrically conductive material that is electrically shorted to itself along a circumferential direction of the separator. FIG. 9 illustrates a cross-sectional view of an example separator 900 having at least one electrically shorted patch of conductive material. The separator 900 may be formed from a tape that has been folded or otherwise formed to have a desired cross-sectional shape, such as the illustrated cross shape. As set forth above, an example tape may include a dielectric substrate layer 905, and one or more patches 910 of electrically conductive material may be formed on the dielectric substrate layer 905. A wide variety of suitable techniques may be utilized to form the tape into a desired cross-sectional shape. For example, the tape may be folded into a desired shape. As another example, the tape may be passed through one or more dies that form the tape into the desired shape.

Figure 10:
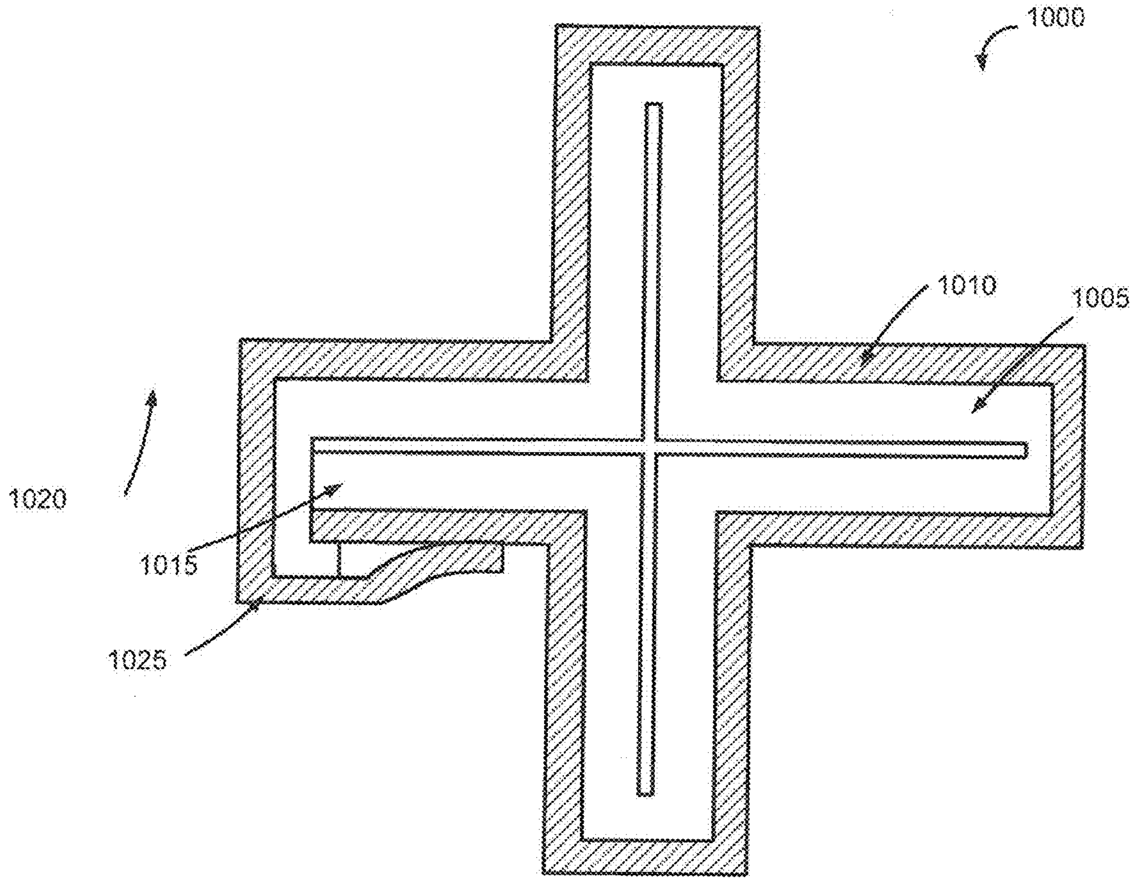

With continued reference to FIG. 9, the dielectric substrate 905 of the tape utilized to form the separator 900 may have a first edge 915 and a second edge 920. As shown, when the tape is formed into the desired cross-sectional shape, the first edge 915 and the second edge 920 may be positioned relatively close to or adjacent to one another. As depicted in FIG. 10, in other embodiments, the second edge 920 may be permitted to overlap the first edge 915, and an associated overlap region may be formed. In conventional separator designs, with the electrically conductive material 910 formed on an outside surface of the substrate 905, the electrically conductive material 910 at the first edge 915 will not typically contact the electrically conductive material 910 at the second edge 920. Indeed, two layers of dielectric material are positioned between the electrically conductive material 910 at the first edge 915 and that at the second edge 920. As a result, a space or gap will typically exist along a longitudinal length of the separator through which noise and/or electrical signals may pass, thereby leading to degradation in shielding performance.

Certain embodiments of the disclosure describe techniques by which spaces or gaps occurring at a circumferential point along a separator 900 may be reduced and/or eliminated. As illustrated in FIG. 9, the electrically conductive material 910 may be formed such that it extends beyond at least one edge of the dielectric substrate 905. In other words, a portion 925 of the electrically conductive material 910 may overhang from at least one edge of the substrate 905, such as the second edge 920. As a result, the electrically conductive material 910 may overlap the first edge 915 and contact the electrically conductive material 910 at or near the first edge 915. In this regard, the electrically conductive material 910 may be circumferentially shorted to itself in a circumferential direction. In other words, the electrically conductive material 910 associated with at least one patch formed on the separator 900 may be shorted to itself such that the electrically conductive material 910 is continuous around a circumference of the separator 900.

A wide variety of suitable techniques may be utilized as desired to form the overhanging portion 925. For example, the dielectric material 905 may be removed from one edge (or a portion of one edge) of the tape. As another example, one or more electrically conductive patches 925 may be formed on or attached to the dielectric material 905 so as to overhang or extend beyond one edge (or one or more portions of one edge) of the dielectric material 905. Additionally, in certain embodiments, the electrically conductive material of a patch may extend beyond an edge of the tape along substantially an entire length of the conductive material. In other embodiments, one or more portions of the electrically conductive material of a patch may extend beyond an edge of the tape.

FIG. 10 is a cross-sectional view of another example separator 1000 that has at least one electrically shorted patch of material, according to an illustrative embodiment of the disclosure. The separator 1000 of FIG. 10 may be similar to the separator 900 described above with reference to FIG. 9. In other words, the separator 1000 may be formed from a tape that has been folded or otherwise formed to have a desired cross shape. The tape may include a dielectric substrate layer 1005, and one or more patches 1010 of electrically conductive material may be formed on the dielectric substrate layer 1005. Additionally, the dielectric substrate layer 1005 utilized to form the separator 1000 may have a first edge 1015 and a second edge 1020. However, in contrast to the separator 1000 illustrated in FIG. 9, the second edge 1020 may be permitted to overlap the first edge 1015 when the desired cross shape is formed. In other words, an overlap region may exist in which the second edge 1020 extends over the first edge 1015 in a circumferential direction. Regardless of whether or not an overlap region is formed in a separator, one or more techniques may be utilized to circumferentially short the electrically conductive material of a patch. Similar to the separator 900 of FIG. 9, in the separator 1000 of FIG. 10, a patch may include an overhanging portion 1025 that extends beyond the second edge 1020 such that it contacts electrically conductive material near the first edge 1015, thereby shorting the patch in a circumferential direction.

FIGS. 9 and 10 illustrate a few example techniques that may be utilized in conjunction with a separator in order to circumferentially short one or more patches of electrically conductive material. However, it will be appreciated that a wide variety of other suitable techniques may be utilized as desired to circumferentially short one or more electrically conductive patches. A few non-limiting examples of suitable techniques are illustrated in FIGS. 11A-11H. FIGS. 11A-11D illustrate example techniques that may be utilized when one edge of a tape (or other structure) overlaps another edge of the tape when a separator is formed. FIGS. 11E-11H illustrate example techniques that may be utilized when substantially no overlap region is formed between the two edges of a tape (or other structure) utilized to form a separator.

Figure 11A:
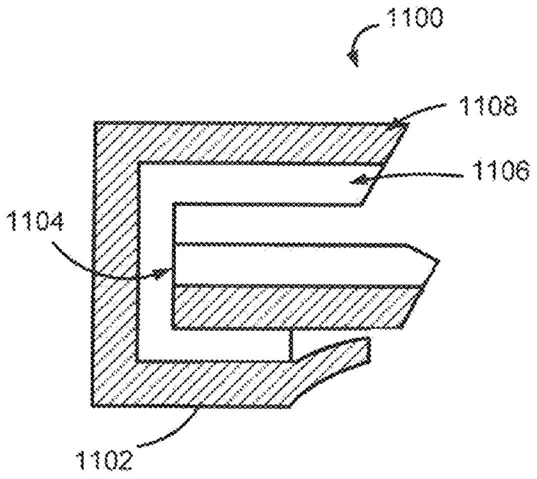
FIGS. 11A-11H illustrate example techniques for creating electrically conductive patches within a separator (or other shielding element), according to illustrative embodiments of the disclosure.

Turning first to FIG. 11A, a first example separator 1100 and associated overlap portion (i.e., portion at which one edge 1102 of the separator 1100 overlaps another edge 1104 of the separator 1100 is illustrated. The illustrated separator 1100 may include a dielectric material 1106, and one or more electrically conductive patches 1108 may be formed on the dielectric material 1106. Along one edge 1102 of the separator 1100 (e.g., an edge along a width dimension of a longitudinally extending tape or other material utilized to form the separator 1100), an overhanging portion 1110 may be formed in which electrically conductive patch material extends beyond the dielectric material 1106. A wide variety of suitable techniques may be utilized as desired to form the overhanging portion 1110. For example, the dielectric material 1106 may be removed from one edge (or a portion of one edge) of the separator 1100. As another example, one or more electrically conductive patches 1108 may be formed on or attached to the dielectric material 1106 so as to overhang or extend beyond one edge 1102 (or one or more portions of one edge 1102) of the dielectric material 1106. Accordingly, when the separator 110 is formed into a desired cross-sectional shape, the two edges (or a first edge and another portion) of an electrically conductive patch 1108 will be brought into contact with one another, thereby creating an electrically shorted patch.

Figure 11B:
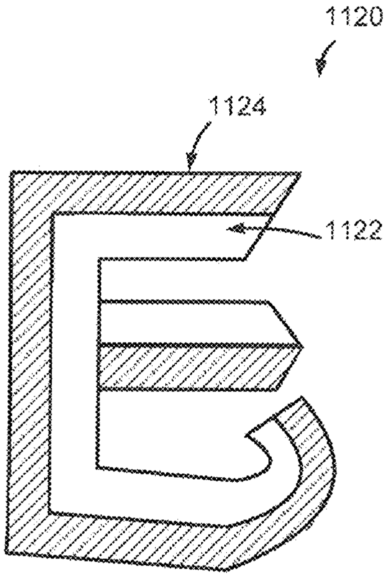

FIG. 11B illustrates another example separator 1120 and associated overlap portion. The separator 1120 may include a dielectric material 1122, and one or more electrically conductive patches 1124 may be formed on the dielectric material 1122. A fold 1126 may be formed at or near one edge of the separator 1120. In other words, the separator 1120 may be folded over itself along one edge or along one or more portions of one edge. Accordingly, when the separator 1120 is formed into a desired cross-sectional shape, the folded edge may be brought into contact with another portion of the separator within an overlapping region and the patch material at or near the folded edge will be brought into contact with the patch material at or near the opposing edge of the separator 1120. As a result, the patch material may be electrically shorted along a circumferential direction of the separator 1120.

Figure 11C:
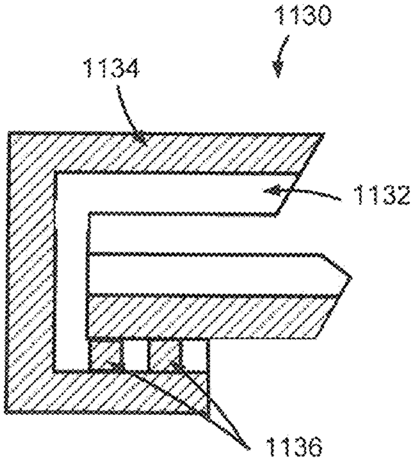

FIG. 11C illustrates another example separator 1130 and associated overlap portion in which electrically shorted patches may be formed. The separator 1130 may include a dielectric material 1132, and one or more electrically conductive patches 1134 may be formed on the dielectric material 1132. Along one edge of the separator 1130 and/or near one edge of the separator 1130, one or more vias 1136 (e.g., metallic or electrically conductive vias, etc.) may be provided in the dielectric material 1132 to permit two portions of a patch 1134 to be brought into contact in the overlap portion when the separator 1130 is formed into a desired cross-sectional shape. Although not specifically illustrated, in other embodiments, one or more gaps or holes may be formed in the dielectric material 1132. Thus, when the separator 1130 is formed into a desired cross-sectional shape, one edge of an electrically conductive patch may be permitted to contact another edge (or portion) of the patch via the one or more gaps or holes.

Figure 11D:
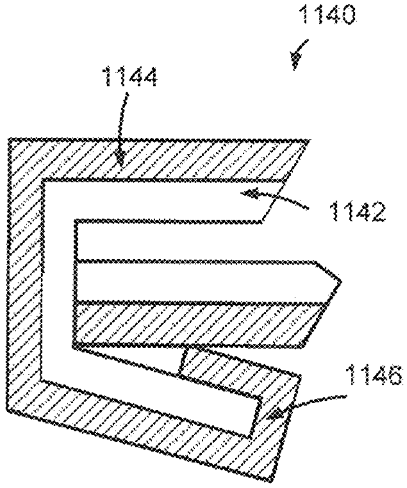

FIG. 11D illustrates another example separator 1140 and associated overlap portion in which electrically shorted patches may be formed. The separator 1140 may include a dielectric material 1142, and one or more electrically conductive patches 1144 may be formed on the dielectric material 1142. A patch 1144 may include an overlapping or double-sided portion 1146 at one edge (or at one or more portions of one edge) of the separator 1140. For example, the patch 1144 may be folded over one edge of the dielectric material 1142 either along one edge or along one or more portions of the edge. As another example, the patch 1144 may be formed on both sides of the dielectric material 1142 along one edge (or at one or more portions of one edge). In other words, at one edge of the separator 1140, an electrically conductive patch 1144 may be present on both sides of the dielectric material 1142. Accordingly, when the separator 1140 is formed into a desired cross-sectional shape, the patch 1144 will be electrically shorted in a circumferential direction.

Figure 11E:
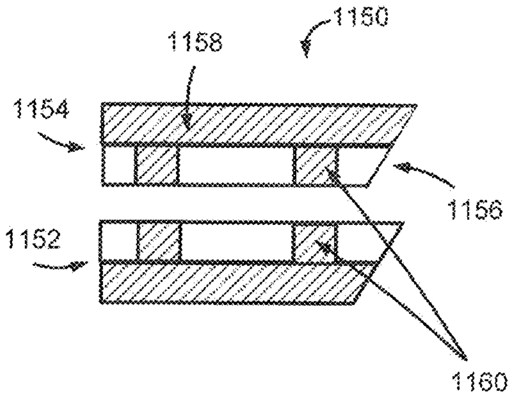

Turning now to example separator designs that do not include an overlapping portion, FIG. 11E illustrates an example separator 1150 in which a first edge 1152 and a second edge 1154 of the separator 1150 are positioned adjacent to or near one another when the separator 1150 is formed into a desired cross-sectional shape. The separator 1150 may include a dielectric material 1156, and one or more electrically conductive patches 1158 may be formed on the dielectric material 1156. Along each edge of the separator 1150 and/or near each edge of the separator 1150, one or more vias 1160 (e.g., metallic or electrically conductive vias, etc.) may be provided in the dielectric material 1156 to permit two portions of a patch 1158 to be brought into contact with one another. As illustrated, one or more of the vias at each edge may be aligned to permit circumferential shorting of the patch 1158. In other embodiments, one or more gaps or holes may be formed in the dielectric material 1156 at or near each edge of the separator 1150. Thus, when the separator 1150 is formed into a desired cross-sectional shape, the electrically conductive material of a patch 1158 at or near each edge may be electrically shorted through the gaps or holes.

Figure 11F:
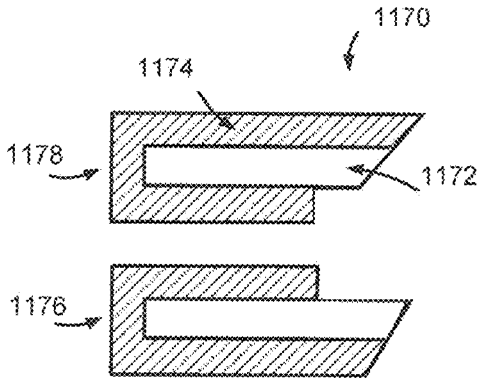

FIG. 11F illustrates another example separator 1170 in which the edges of the separator are positioned adjacent to or near one another when the separator 1170 is formed into a desired cross-sectional shape. The separator 1170 may include a dielectric material 1172, and one or more electrically conductive patches 1174 may be formed on the dielectric material 1172. Respective folds 1176, 1178 may be formed at or near each edge of the separator 1170. In other words, the separator 1120 may be folded over itself along one edge or along one or more portions of one edge. Accordingly, when the separator 1170 is formed into a desired cross-sectional shape, the folded edges may be brought into contact with one another such that the electrically conductive material at or near each edge is shorted to itself. As desired in various embodiments, folds may be formed along either one or more entire edges of the separator 1170, along edge portions at which electrically conductive material is present, and/or at one or more portions of the edge(s) at which electrically conductive material is present.

Figure 11G:
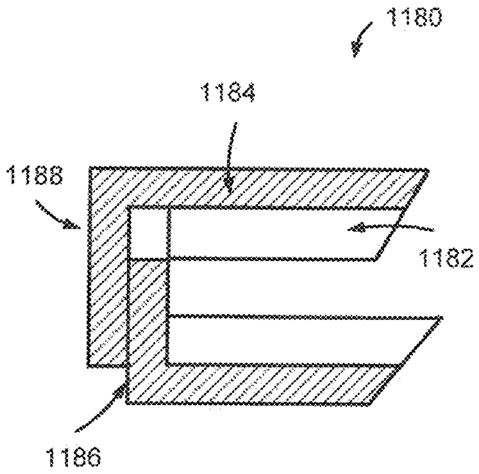

FIG. 11G illustrates another example separator 1180 in which the edges of the separator are positioned adjacent to or near one another when the separator 1180 is formed into a desired cross-sectional shape. The illustrated separator 1180 may include a dielectric material 1182, and one or more electrically conductive patches 1184 may be formed on the dielectric material 1182. Along one or both edges of the separator 1180, an overhanging portion may be formed in which electrically conductive patch material extends beyond the dielectric material 1182. As shown in FIG. 110G, respective overhanging portions 1186, 1188 are formed along each edge of the separator 1180. In other embodiments, as illustrated in FIG. 9, an overhanging portion may be formed at a single edge of the separator. As set forth above with reference to FIG. 11A, a wide variety of suitable techniques may be utilized as desired to form the overhanging portion(s). Additionally, as desired in various embodiments, overhanging portions may be formed along either an entire edge of the separator at which electrically conductive material is present and/or at one or more portions of an edge at which electrically conductive material is present.

Figure 11H:
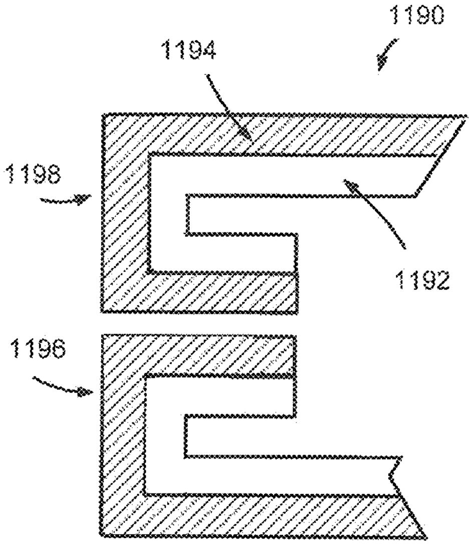

FIG. 11H illustrates another example separator 1190 in which the edges of the separator are positioned adjacent to or near one another when the separator 1180 is formed into a desired cross-sectional shape. The separator 1190 may include a dielectric material 1192, and one or more electrically conductive patches 1194 may be formed on the dielectric material 1192. A patch 1194 may include respective overlapping or double-sided portions 1196, 1198 at each edge (or at one or more portions of each edge) of the separator 1190. For example, the patch 1194 may be folded over one or more edges of the dielectric material 1192 either along the edges or along one or more portions of the edges. As another example, the patch 1194 may be formed on both sides of the dielectric material 1192 along one or more edge (or at one or more portions of one edge). In other words, at the edges of the separator 1190, an electrically conductive patch 1194 may be present on both sides of the dielectric material 1192. Accordingly, when the separator 1190 is formed into a desired cross-sectional shape, the patch 1194 will be electrically shorted in a circumferential direction.

A wide variety of other suitable methods and/or techniques may be utilized as desired to form separators including discontinuous patches that are electrically shorted in the circumferential direction. The techniques described above are provided by way of example only. Additionally, in certain embodiments, a combination of techniques may be utilized. For example, one edge of a separator may include holes and/or vias in the dielectric material and an opposite edge of the separator may include a folded edge or an edge in which electrically conductive material is formed on each side of the dielectric material.

Figure 12:
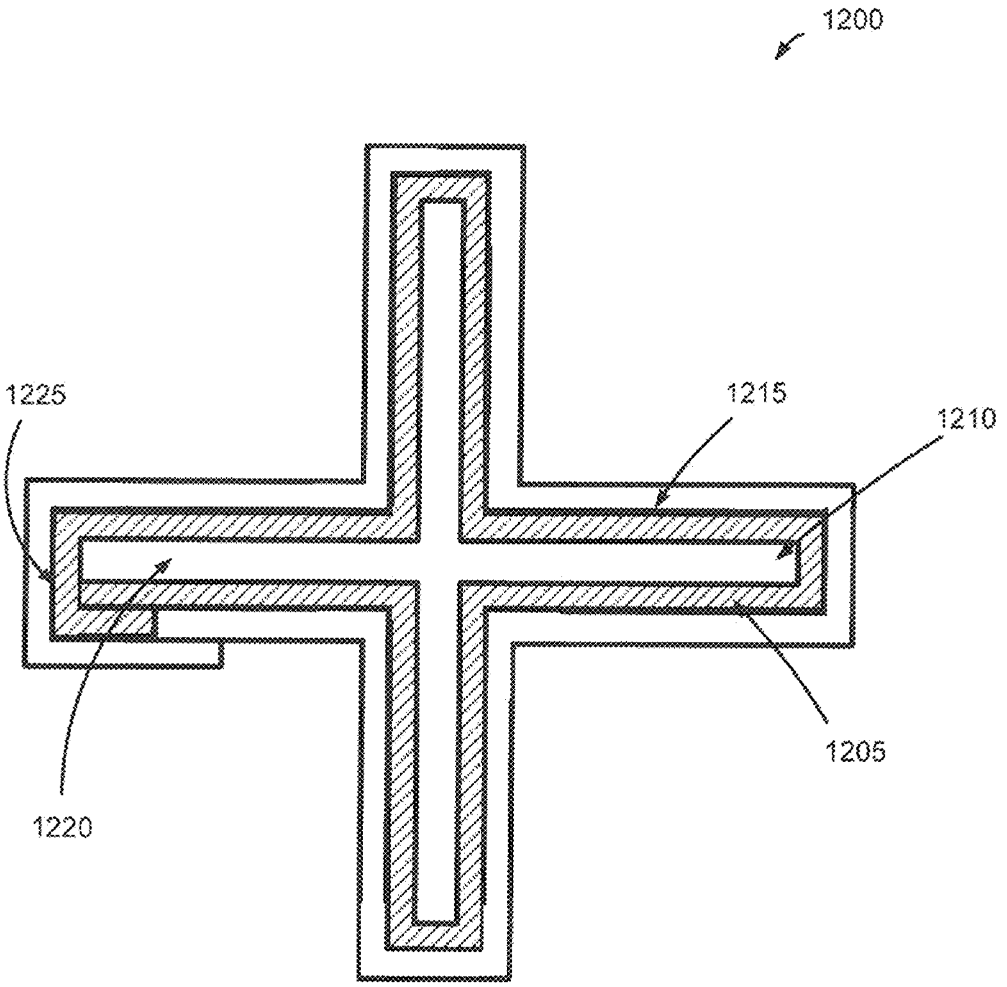
FIGS. 12-15 are cross-sectional views of other example separators that have at least one electrically shorted patch of material, according to an illustrative embodiment of the disclosure.

The separators illustrated in FIGS. 9, 10, and 11A-11H include electrically conductive material formed on a single dielectric layer. However, as set forth above, in other embodiments, a separator may include multiple dielectric layers and/or layers of electrically conductive material. Regardless of the construction of the separator, one or more suitable techniques may be utilized to short one or more electrically conductive patches along a circumferential direction of the separator. FIG. 12 illustrates a cross-sectional view of an example separator 1200 in which electrically conductive material 1205 is sandwiched between two dielectric layers 1210, 1215. Even with the "sandwich" structure, a wide variety of suitable techniques may be utilized to circumferentially short the electrically conductive material 1205.

The separator 1200 may include a first end 1220 and a second end 1225. As shown in FIG. 12, the first end 1220 and the second end 1225 may be positioned relatively close to or adjacent to one another when the separator 1200 is formed into a desired cross-sectional shape. Additionally, the electrically conductive material 1205 and optionally the outer dielectric layer 1215 may extend beyond or overhang the second end 1225 such that the overhanging electrically conductive material may be brought into contact with electrically conductive material near the first end 1220. Additionally, the outer dielectric layer 1215 may not extend all the way to the first end 1220 such that the electrically conductive material 1205 may be circumferentially shorted. In other embodiments, a wide variety of suitable vias, holes, gaps, folds, overhanging portions, etc. may be utilized to circumferentially short the electrically conductive material.

Figure 13:
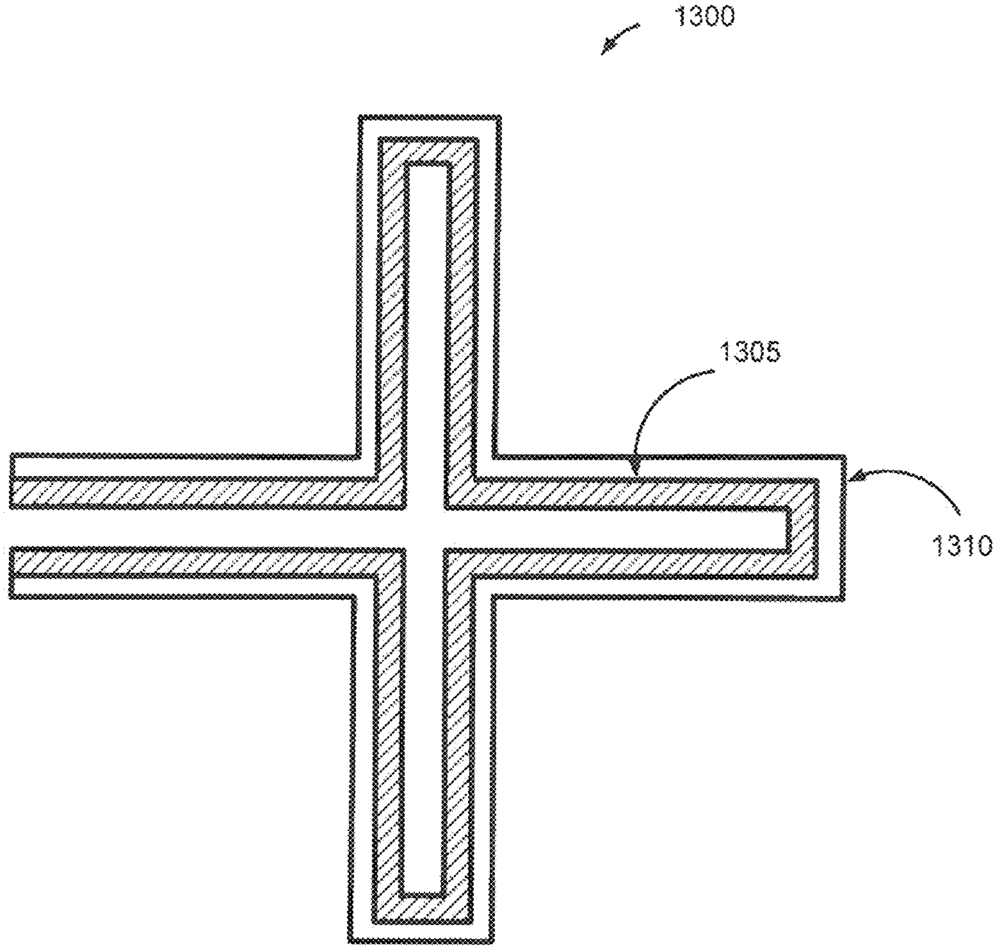

FIG. 13 is a cross-sectional views of another example separator 1300 that includes at least one electrically shorted patch of material, according to an illustrative embodiment of the disclosure. Similar to some of the separators described above, the separator 1300 may be formed from a tape or similar structure that include one or more patches or electrically conductive material 1305 formed on a dielectric substrate layer 1310. The tape may then be folded or otherwise formed into a desired cross-sectional shape, such as the illustrated cross shape. However, in contrast to the separators 900, 1000 illustrated in FIGS. 9 and 10, the electrically conductive material 1305 of the separator 1300 in FIG. 13 is formed on an inside or interior surface of the dielectric substrate layer 1310. In other words, when the separator 1300 is formed into a desired cross-sectional shape, the electrically conductive material 1305 constitutes an interior layer of the separator 1300. As a result, various portions of the electrically conductive material 1305 will contact one another, and the electrically conductive material 1305 will be shorted to itself in a circumferential direction. In other embodiments, the electrically conductive material may be sandwiched between two layers of dielectric material; however, the interior dielectric layer may be formed as a partial layer having spaces or gaps that permit the electrically conductive material 1305 to be electrically shorted.

Figure 14:
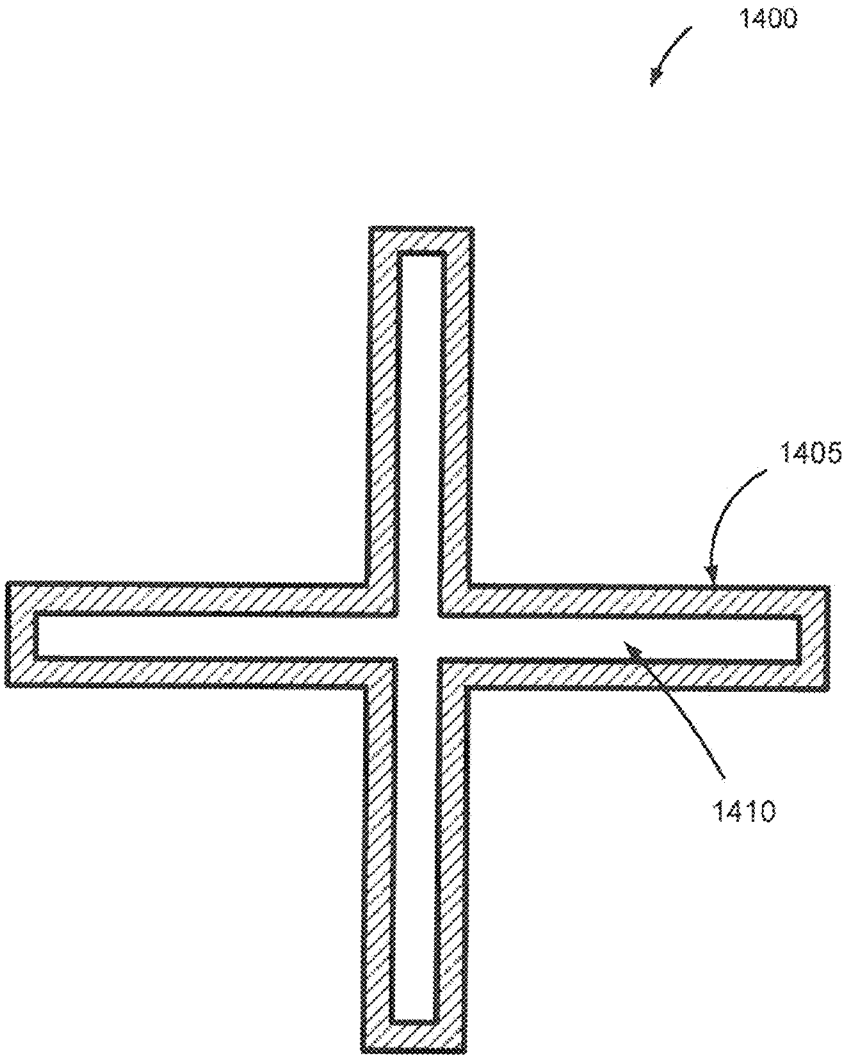

Although many of the separators discussed above are described as being formed from a suitable tape or other structure that is folded or formed into a desired cross-sectional shape, other separators may be formed with a relatively solid dielectric base layer. For example, a dielectric base layer may be formed from one or more extruded, poltruded, foamed, or other relatively solid materials. Electrically conductive material may then be formed or applied to the base layer, inserted into the base layer, or embedded in the base layer. FIG. 14 illustrates a cross-sectional view of an example separator 1400 that includes one or more electrically conductive patches 1405 formed on a relatively solid base layer 1410. As shown, at least a portion of a patch 1405 may extend around the entire circumference of the base layer 1410 such that the patch 1405 is electrically shorted to itself in a circumferential direction.

Figure 15:
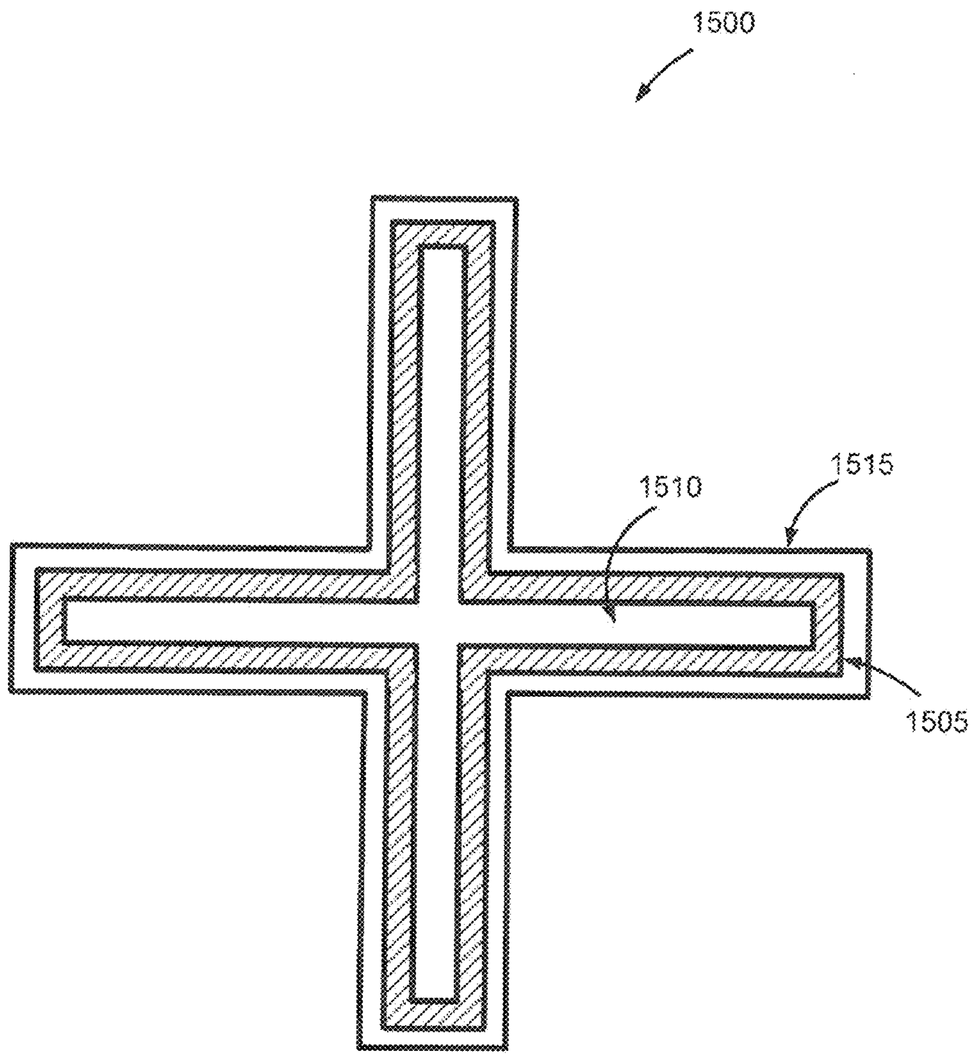

FIG. 15 is cross-sectional view of another example separator 1500 that includes one or more electrically conductive patches 1505 formed on a relatively solid dielectric base layer 1510. Similar to the separator 1400 of FIG. 14, at least a portion of a patch 1505 may extend around the entire circumference of the base layer 1510 such that the patch 1505 is electrically shorted to itself in a circumferential direction. However, in the separator 1500 of FIG. 15, another dielectric layer 1510 may be formed over the electrically conductive patch(es) 1505. In other words, the electrically conductive patch(es) 1505 may be sandwiched between two layers 1510, 1515 of dielectric material. In other embodiments, electrically conductive material may be embedded in a single base layer of dielectric material.

Figure 16A:
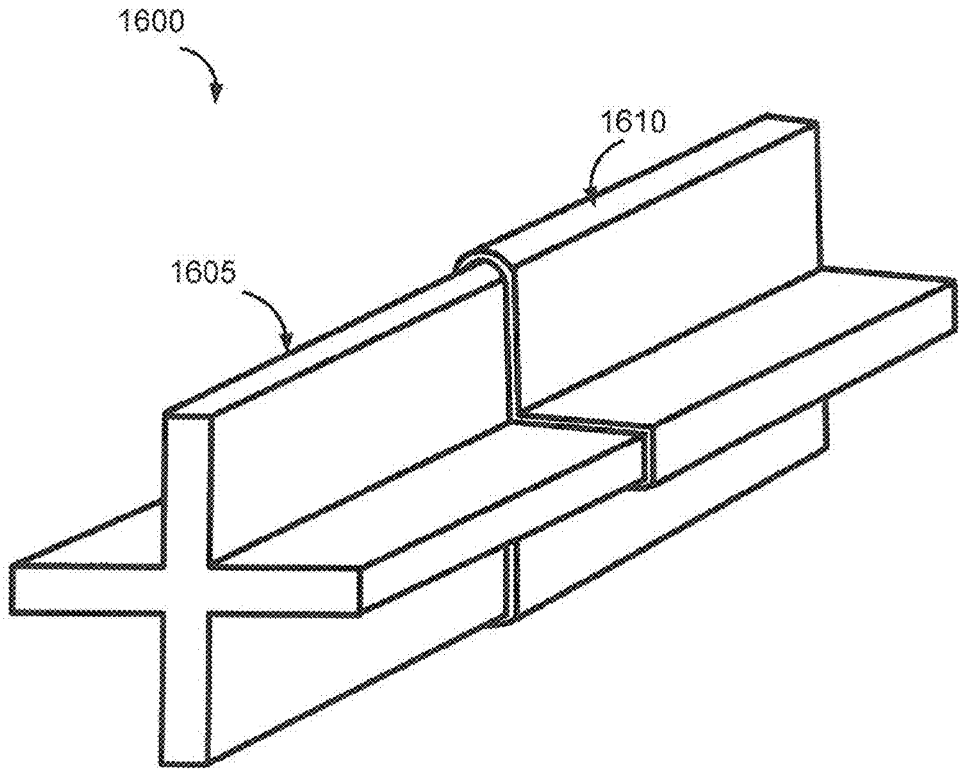
FIG. 16A illustrates a perspective view of an example separator formed from overlapping segments, according to an illustrative embodiment of the disclosure.

As set forth above, in certain embodiments, a separator may be formed to include a plurality of longitudinally overlapping segments, and each segment may include one or more discontinuous electrically conductive patches. FIG. 16A illustrates a perspective view of an example separator 1600 formed with overlapping segments, according to an illustrative embodiment of the disclosure. The separator 1600 may be formed from a plurality of longitudinally extending discrete segments, such as the two illustrated segments 1605, 1610. Each segment 1605, 1610 may include one or more patches of electrically conductive material, such as metallic patches formed on a dielectric base layer or base material. Further, an overlap may be formed between each adjacent shield segment. For example, a first segment 1605 may include a first end and a second end along a longitudinal direction of the separator 1600. A second segment 1610 may also include a first end and a second end. The first end of the second segment 1610 may overlap the second end of the first segment 1605. As desired, a third segment may also be formed, and a first end of the third segment may overlap the second end of the second segment 1610. Any number of other separator segments may be formed in a similar manner. Other segment overlapping configurations may be utilized as desired in various embodiments. For example, both a first segment and the third segment may overlap the second segment. Indeed, a wide variety of overlapping configurations is possible and will be appreciated by those of ordinary skill in the art.

In certain embodiments, when an overlap is formed between two segments (e.g., segments 1605, 1610), the overlap may effectively cover a gap or space that would normally be present between patches of electrically conductive material. A conventional separator may be formed from a single segment, and spaces or gaps may exist between discontinuous electrically conductive patches incorporated into the separator. By contrast, with an overlapping separator 1600, each segment 1605, 1610 may include at least one electrically conductive patch. When the second segment 1610 is formed or positioned to overlap the first segment 1605, no longitudinal gaps or spaces will exist along the length of the separator 1600 between the electrically conductive patches formed on the segments 1605, 1610 (or at least the patches formed at the overlapping edges). For example, the electrically conductive material at the second end of the first segment 1605 may be in contact with dielectric material at the first end of the second segment 1610, and the electrically conductive material at the first end of the second segment 1610 may be formed on top of the dielectric material of the second segment 1610. Thus, the electrically conductive material of each segment will remain discontinuous; however, the combined electrically conductive material may effectively function as a continuous shield.

In certain embodiments, individual separator segments 1605, 1610 may be separately formed and incorporated into a cable during cable construction. In other words, individual separator segments may be overlapped in an inline process during cable assembly. In other embodiments, a separator 1600 may be formed from a plurality of overlapping segments 1605, 1610 in an offline process, and the formed separator 1600 may subsequently be be wrapped around the twisted pairs 405. For example, individual segments may be incorporated into a cable.

Figure 16B:
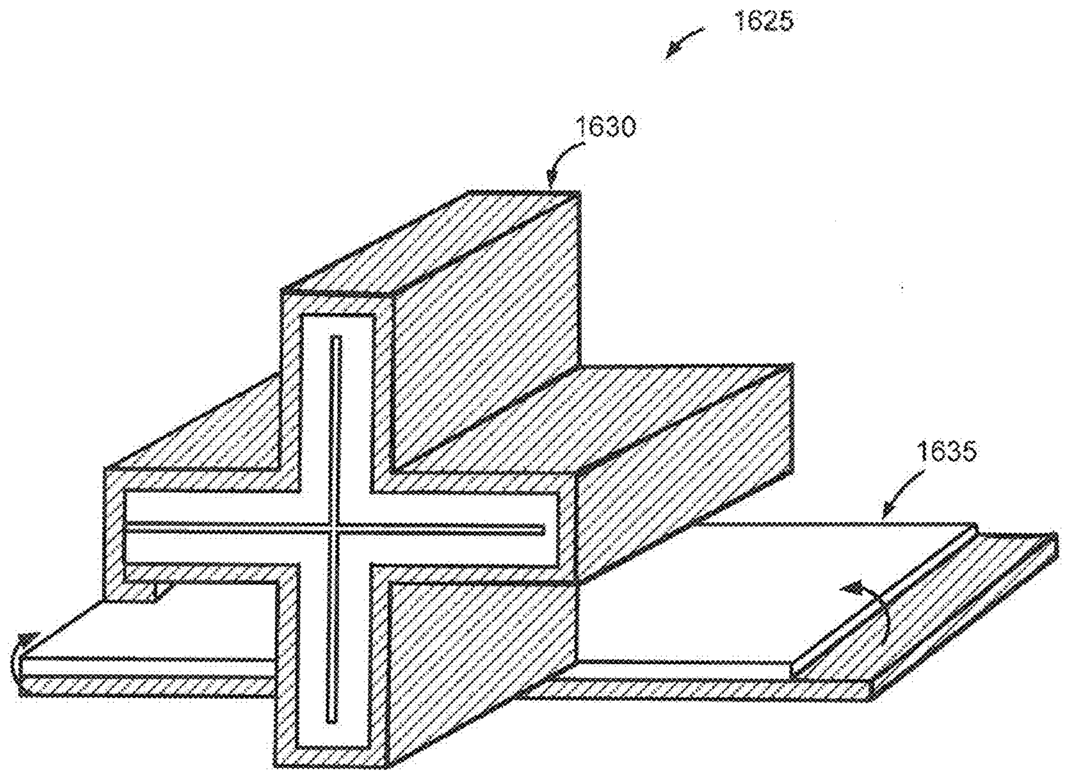
FIG. 16B illustrates an example technique for forming a separator that includes overlapping segments, in accordance with certain embodiments of the disclosure.

A wide variety of suitable techniques may be utilized as desired to form a separator having overlapping segments. FIG. 16B illustrates one example technique for forming such a separator 1625. The example separator 1625 may be formed from one or more suitable tapes that formed into a desired cross-sectional shape. As mentioned above, a wide variety of techniques may be utilized to form a tape into a desired shape, such as folding or the passing of the tape through one or more suitable dies. As shown, a first tape 1630 has already been formed into a longitudinally extending separator segment having a desired shape. The first tape 1630 may include a dielectric layer, and one or more patches of electrically conductive material may be formed on the dielectric layer. Additionally, in certain embodiments, at least one patch formed on the first segment may be shorted to itself in a circumferential direction.

With continued reference to FIG. 16B, a second tape 1635 is illustrated as a relatively flat tape that has not yet been formed and/or processed into a desired shape. In order to form a second separator segment, the second tape 1635 may be processed into a desired cross-sectional shape. Additionally, the second segment may be formed and/or positioned such that one longitudinal end of the second segment overlaps an adjacent end of the first segment. In certain embodiments, the second tape 1635 may be formed such that an overlap occurs during the formation process. For example, the second tape 1635 may be folded around the first segment. In other embodiments, the second tape 1635 may be formed into a desired shape, and then the formed segment may be positioned such that it overlaps the first segment. In yet other embodiments, the first and second tapes 1630, 1635 may be concurrently processed such that overlapping segments are formed. For example, the tapes 1630, 1635 may be positioned such that adjacent edges overlap one another, and the tapes 1630, 1635 may then be passed through one or more suitable dies in order to form a desired cross-sectional shape.

In embodiments in which separator segments have relatively solid base layers, a wide variety of suitable techniques may be utilized in order to form an overlapping separator. For example, each separator segment may be formed to include one end configured to be inserted into another separator segment (e.g., a male end) and another end configured to receive another separator segment (e.g., a female end). During assembly of a separator, the male end of a separator segment may be inserted into a corresponding female end of an adjacent segment. This process may be repeated with additional segments until a suitable separator is assembled.

Conditional language, such as, among others, "can," "could," "might," or "may," unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A cable comprising:

at least one twisted pair of individually insulated conductors;

a shield element positioned adjacent to the at least one twisted pair, the shield comprising:

a plurality of segments positioned along a longitudinal direction of the cable, each segment comprising a respective dielectric substrate with electrically conductive material formed on the substrate, and each segment electrically isolated from the other segments, wherein a respective overlap is formed between adjacent segments along a shared longitudinal edge, and wherein, for each pair of overlapping adjacent segments, the dielectric substrate of an overlapping segment is positioned between the respective electrically conductive material of the two adjacent segments; and a jacket formed around the at least one twisted pair and the shield.

2. The cable of claim 1, wherein the at least one twisted pair comprises a plurality of twisted pairs, and wherein the shield element comprises a separator positioned between at least two of the plurality of twisted pairs.

3. The cable of claim 1, wherein a first segment included in the plurality of segments overlaps a second segment included in the plurality of segments by approximately one half inch or greater.

4. The cable of claim 1, wherein a first segment included in the plurality of segments overlaps a second segment included in the plurality of segments by approximately one inch or greater.

5. The cable of claim 1, wherein the plurality of segments comprises a first segment, a second segment, and a third segment, each segment comprising a respective first end and a respective second end opposite the first end along the longitudinal direction, wherein the first end of the second segment overlaps the second end of the first segment, and wherein the first end of the third segment overlaps the second end of the second segment.

6. The cable of claim 1, wherein the electrically conductive material covers substantially an entire surface of the dielectric substrate of at least one of the plurality of segments.

7. The cable of claim 1, wherein electrically conductive material on at least one of the plurality of segments is electrically shorted to itself in a circumferential direction.

8. The cable of claim 7, wherein the at least one segment extends in the longitudinal direction of the cable and further comprises a first edge and a second edge along a width dimension, and wherein either (i) the segment is folded over itself at one or more points along at least one of the first edge or the second edge, (ii) the electrically conductive material extends beyond the dielectric substrate at one or more points along at least one of the first edge or the second edge, (iii) the electrically conductive material is formed on opposing sides of the dielectric substrate at one or more points along at least one of the first edge the second edge, (iv) one or more openings are formed in the dielectric substrate at or near at least one of the first edge or the second edge, or (v) one or more electrically conductive vias are formed through the dielectric substrate at or near at least one of the first edge or the second edge.

9. The cable of claim 1, wherein each of the plurality of segments has a length of approximately two meters or greater.

10. A cable comprising:

a plurality of twisted pairs of individually insulated electrical conductors;

a separator positioned between at least two of the plurality of twisted pairs, the separator comprising a plurality of discrete individual segments positioned adjacent to one another along a longitudinal length of the cable, each segment comprising electrically conductive material formed on a respective dielectric substrate, wherein a respective overlap is formed between each pair of adjacent segments and, for at least one pair of segments, the dielectric substrate of an overlapping segment is positioned between the respective electrically conductive material of the pair of segments; and a jacket formed around the at least one twisted pair and the shield.

11. The cable of claim 10, wherein a cross-section of the separator has one of (i) a cross shape, (ii) a T-shape, (iii) a Y-shape, (iv) an L-shape, (v) a J-shape, (vi) a diamond shape, or (vii) a rod shape.

12. The cable of claim 10, wherein a first segment included in the plurality of segments overlaps a second segment included in the plurality of segments by approximately one half inch or greater.

13. The cable of claim 10, wherein the electrically conductive material covers substantially an entire surface of the dielectric substrate of at least one of the plurality of segments.

14. The cable of claim 10, wherein a plurality of discrete patches of electrically conductive material are formed on the dielectric substrate of at least one of the plurality of segments.

15. The cable of claim 10, wherein electrically conductive material on at least one of the plurality of segments is electrically shorted to itself in a circumferential direction.

16. The cable of claim 15, wherein the at least one segment extends in the longitudinal direction of the cable and further comprises a first edge and a second edge along a width dimension, and wherein either (i) the segment is folded over itself at one or more points along at least one of the first edge or the second edge, (ii) the electrically conductive material extends beyond the dielectric substrate at one or more points along at least one of the first edge or the second edge, (iii) the electrically conductive material is formed on opposing sides of the dielectric substrate at one or more points along at least one of the first edge the second edge, (iv) one or more openings are formed in the dielectric substrate at or near at least one of the first edge or the second edge, or (v) one or more electrically conductive vias are formed through the dielectric substrate at or near at least one of the first edge or the second edge.

17. The cable of claim 10, wherein each of the plurality of segments has a length of approximately two meters or greater.

18. A cable comprising:

a plurality of transmission media;

a separator formed between at least two of the plurality of transmission media, the separator comprising a plurality of electrically isolated segments longitudinally arranged along a length of the cable with a respective overlap formed between adjacent segments, each segment comprising:

a dielectric substrate; and electrically conductive material formed on the dielectric substrate; and a jacket formed around the plurality of transmission media and the separator, wherein, for each pair of overlapping adjacent segments, the dielectric substrate of an overlapping segment is positioned between the respective electrically conductive material of the two adjacent segments.

19. The cable of claim 18, wherein each segment has a length of approximately two meters or greater.

20. The cable of claim 18, wherein a first segment included in the plurality of segments overlaps a second segment included in the plurality of segments by approximately one half inch or greater.

* * * * *

UNITED STATES PATENT AND TRADEMARK OFFICE

CERTIFICATE OF CORRECTION

PATENT NO. : 9,275,776 B1
APPLICATION NO. : 14/578921
DATED : March 1, 2016
INVENTOR(S) : Christopher W. McNutt It is certified that error appears in the above-identified patent and that said Letters Patent is hereby corrected as shown below:

Title page

(75) Inventor: "Christopher W. McNut", should read --Christopher W. McNutt--

Signed and Sealed this
Third Day of May, 2016

*Michelle K. Lee*

Michelle K. Lee
*Director of the United States Patent and Trademark Office*